US009082909B2

(12) United States Patent
Cho et al.

(10) Patent No.: US 9,082,909 B2
(45) Date of Patent: Jul. 14, 2015

(54) OPTICAL DEVICE INCLUDING THREE COUPLED QUANTUM WELL STRUCTURE

(71) Applicants: SAMSUNG ELECTRONICS CO., LTD., Suwon-si (KR); GWANGJU INSTITUTE OF SCIENCE AND TECHNOLOGY, Gwangju (KR)

(72) Inventors: Yong-chul Cho, Suwon-si (KR); Yong-tak Lee, Gwangju (KR); Chang-young Park, Yongin-si (KR); Byung-hoon Na, Suwon-si (KR); Yong-hwa Park, Yongin-si (KR); Gun-wu Ju, Daegu (KR); Hee-ju Chio, Jeonju-si (KR)

(73) Assignees: SAMSUNG ELECTRONICS CO., LTD., Suwon-si (KR); GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 0 days.

(21) Appl. No.: 14/148,009

(22) Filed: Jan. 6, 2014

(65) Prior Publication Data

US 2014/0191196 A1   Jul. 10, 2014

(30) Foreign Application Priority Data

Jan. 4, 2013  (KR) .................. 10-2013-0001214

(51) Int. Cl.
*H01L 31/0352* (2006.01)
(52) U.S. Cl.
CPC .............................. *H01L 31/035209* (2013.01)
(58) Field of Classification Search
CPC ............ B82Y 20/00; H01L 31/035209; H01L 31/035236; H01L 31/32
USPC ......... 257/21, 14, 15, 431; 977/761, 712, 759
See application file for complete search history.

(56) References Cited

U.S. PATENT DOCUMENTS 4,525,687 A  6/1985  Chemla et al.
5,077,593 A * 12/1991  Sato et al. ...................... 257/21

(Continued)

FOREIGN PATENT DOCUMENTS

KR     19970048681 A    7/1997
KR   1020110086364 A    7/2011

(Continued)

OTHER PUBLICATIONS

M. Nagase et al., Intersubband Transitions in InGaAs/AlAsSb Coupled Double Quantum Wells with InAlAs Coupling Barriers, Proceedings of 2007 International Conference on Indium Phosphide and-Related Materials, May 14-18, 2007, Matsue, Japan, pp. 502-505.*

(Continued)

*Primary Examiner* — Nikolay Yushin
(74) *Attorney, Agent, or Firm* — Sughrue Mion, PLLC

(57) ABSTRACT

Provided is an optical device which includes an active layer which includes at least two outer barriers and at least one coupled quantum well, each of the at least one coupled quantum well is sandwiched between the at least two outer barriers. Each of the at least one coupled quantum well includes at least three quantum well layers and at least two coupling barriers interposed between the at least three quantum layers. The at least two coupling barriers have a potential energy which is higher than a ground level and is lower than energy levels of the at least two outer barriers.

34 Claims, 16 Drawing Sheets

(56) References Cited

U.S. PATENT DOCUMENTS

| | | | |
|---|---|---|---|
| 5,286,982 | A | 2/1994 | Ackley et al. |
| 5,426,512 | A | 6/1995 | Watson |
| 5,521,742 | A | 5/1996 | Ishimura |
| 5,569,934 | A | 10/1996 | Fujii et al. |
| 6,100,543 | A | 8/2000 | Sakata |
| 6,154,299 | A | 11/2000 | Gilbreath et al. |
| 6,331,911 | B1 | 12/2001 | Manassen et al. |
| 6,956,232 | B2 | 10/2005 | Reynolds |
| 8,179,585 | B2 | 5/2012 | Nagase et al. |
| 8,492,863 | B2 * | 7/2013 | Cho et al. ............. 257/431 |
| 2005/0117623 | A1 * | 6/2005 | Shchukin et al. .......... 372/97 |
| 2011/0101301 | A1 * | 5/2011 | Lin et al. ................ 257/13 |
| 2011/0181936 | A1 * | 7/2011 | Cho et al. ............. 359/260 |

FOREIGN PATENT DOCUMENTS

| | | |
|---|---|---|
| KR | 1020120018581 A | 3/2012 |
| KR | 1020120075182 A | 7/2012 |

OTHER PUBLICATIONS

Kenji Nakamura et al., "Numerical Analysis of the Absorption and the Refractive Index Change in Arbitrary Semiconductor Quantum-Well Structures," IEEE Journal of Quantum Electronics, vol. 28, No. 7, Jul. 1992, pp. 1670 to 1677.

Yong-Hwa Park et al., "Micro optical system based 3D imaging for full HD depth image capturing," Proc. of SPIE vol. 8252, 2012, pp. 82520X-1 to 82520X-15.

Hao Feng et al., "Field-Induced Optical Effect in a Five-Step Asymmetric Coupled Quantum Well with Modified Potential," IEEE Journal of Quantum Electronics, vol. 23, No. 7, Jul. 1998, pp. 1197 to 1208.

T.K. Woodward et al., "Comparison of stepped-well and square-well multiple-quantum-well optical modulators," American Institute of Physics, 78 (3), Aug. 1, 1995, pp. 1411 to 1414.

K.W. Goossen et al., "Stacked-Diode Electroabsorption Modulator," IEEE Photonics Technology Letters, vol. 6, No. 8, Aug. 1994, pp. 936 to 938.

E. Herbert Li et al., "Quantum-confined Stark effect in interdiffused AlGaAs/GaAs quantum well," Appl. Phys. Lett., American Institute of Physics, 63 (4), Jul. 26, 1993, pp. 533 to 535.

Zhixin Xu., "Quasi-symmetric coupled quantum well and its electro-optical properties," Proc. of SPIE vol. 6020, 2005, pp. 60202B-1 to 60202B-7.

Charles Garvin et al., "Overview of high-speed multiple quantum well optical modulator devices and their applications at Lockheed Martin Sanders," SPIE Conference on Algorithms, Devices, and Systems for Optical Information Processing, SPIE vol. 3466, Jul. 1996, pp. 145 to 156.

Abedi, Kambiz, "Improvement of Saturation Optical Intensity in Electroabsorption Modulators with Asymmetric Intra-step-barrier Coupled Double Strained Quantum Wells," Canadian Journal on Electrical and Electronics Engineering, vol. 2, No. 4, Apr. 2011, pp. 83 to 89.

H. Mohseni et al., "High-Performance Optical Modulators Based on Stepped Quantum Wells," Proc. of SPIE, vol. 6127, 2006, pp. 61270D-1 to 61270D-11.

Liu, Hong, "High Speed, Low Driving Voltage Vertical Cavity MQW Modulators for Optical Interconnect and Communication," Mar. 2001, pp. i to 119 (134 pages).

M.N. Islam., "Electroabsorption in GaAs/AlGaAs coupled quantum well waveguides," Appl. Phys. Lett. American Institute of Physics, 50 (16), Apr. 20, 1987, pp. 1098 to 1100.

Nacer Debbar et al., "Coupled GaAs.AlGaAs quantum-well electroabsorption modulators for low-electric-field optical modulation," J. Appl. Phys., American Institute of Physics, 65 (1), Jan. 1, 1989, pp. 383 to 385.

Jason Thalken et al., "Adaptive design of excitonic absorption in broken-symmetry quantum wells," Applied Physics Letters, vol. 85, No. 1, Jul. 5, 2004, pp. 121 to 123.

Zhi-Xin Xi et al., "A Novel Coupled Quantum Well Structure with Low-Driving Voltage, Low Absorption Loss and Large Field-Induced Refractive Index Change," Chin. Phys. Lett. Chinese Physical Society and IOP Publishing Ltd, vol. 22, No. 4, 2005, pp. 956 to 959.

* cited by examiner

FIG. 7

| Material | Thickness[Å] | Remarks | Doping |
|---|---|---|---|
| p-GaAs | 100 | p-contact | $1 \times 10^{18} cm^{-3}$ |
| $Al_{0.31}Ga_{0.80}As$ | 500 | Cladding | Undoped |
| GaAs | 20 | Active (3ACQW-15pair) | |
| $Al_{0.20}Ga_{0.80}As$ | 10 | | |
| GaAs | 66 | | |
| $Al_{0.20}Ga_{0.80}As$ | 10 | | |
| GaAs | 30 | | |
| $Al_{0.31}Ga_{0.69}As$ | 40 | | |
| GaAs | 20 | (3ACQW 1pair) | |
| $Al_{0.20}Ga_{0.80}As$ | 10 | | |
| GaAs | 66 | | |
| $Al_{0.20}Ga_{0.80}As$ | 10 | | |
| GaAs | 30 | | |
| $Al_{0.31}Ga_{0.69}As$ | 500 | Cladding | |
| n-InGaP | 1000 | n-contact | $2 \times 10^{18} cm^{-3}$ |
| GaAs substrate | | | |

FIG. 10

| | Remarks | Material | Thickness[Å] |
|---|---|---|---|
| 141 | p-contact | p-GaAs | 100 |
| 140 | Top DBR 2 pairs | p-$Al_{0.31}Ga_{0.69}As$ | 516 |
| | | p-$Al_{0.88}Ga_{0.12}As$ | 688 |
| | | p-$Al_{0.31}Ga_{0.69}As$ | 623 |
| | | p-$Al_{0.88}Ga_{0.12}As$ | 688 |
| 130 | Cladding | $Al_{0.31}Ga_{0.69}As$ | 112 |
| | 3ACQW 25 pairs | GaAs | 20 |
| | | $Al_{0.20}Ga_{0.80}As$ | 10 |
| | | GaAs | 66 |
| | | $Al_{0.20}Ga_{0.80}As$ | 10 |
| | | GaAs | 30 |
| | | $Al_{0.31}Ga_{0.69}As$ | 40 |
| | 3ACQW spare 1pair | GaAs | 20 |
| | | $Al_{0.20}Ga_{0.80}As$ | 10 |
| | | GaAs | 66 |
| | | $Al_{0.20}Ga_{0.80}As$ | 10 |
| | | GaAs | 30 |
| | Cladding | $Al_{0.31}Ga_{0.69}As$ | 112 |
| 120 | Bottom DBR 25.5 pairs | n-$Al_{0.88}Ga_{0.12}As$ | 688 |
| | | n-$Al_{0.31}Ga_{0.69}As$ | 623 |
| | | n-$Al_{0.88}Ga_{0.12}As$ | 688 |
| 111 | n-contact | n-GaAs | 5000 |
| 110 | | GaAs substrate | |

FIG. 13

| | Remarks | 3ACQW | |
| --- | --- | --- | --- |
| | | Material | Thickness[Å] |
| 241 | Contact | p-GaAs | 100 |
| 240 | Top DBR 1 pair | p-Al$_{0.31}$Ga$_{0.69}$As | 516 |
| | | p-Al$_{0.88}$Ga$_{0.12}$As | 688 |
| | Top DBR 5 pairs | p-Al$_{0.31}$Ga$_{0.69}$As | 623 |
| | | p-Al$_{0.88}$Ga$_{0.12}$As | 688 |
| 230 | Cladding | Al$_{0.31}$Ga$_{0.69}$As | 65 |
| | 3ACQW (39 pairs) | GaAs | 20 |
| | | Al$_{0.20}$Ga$_{0.80}$As | 10 |
| | | GaAs | 66 |
| | | Al$_{0.20}$Ga$_{0.80}$As | 10 |
| | | GaAs | 30 |
| | | Al$_{0.31}$Ga$_{0.69}$As | 40 |
| | 3ACQW spare 1 pair | GaAs | 20 |
| | | Al$_{0.20}$Ga$_{0.80}$As | 10 |
| | | GaAs | 66 |
| | | Al$_{0.20}$Ga$_{0.80}$As | 10 |
| | | GaAs | 30 |
| | Cladding | Al$_{0.31}$Ga$_{0.69}$As | 65 |
| 220 | Bottom DBR 5 pairs | n-Al$_{0.88}$Ga$_{0.12}$As | 688 |
| | | n-Al$_{0.31}$Ga$_{0.69}$As | 623 |
| | Bottom DBR 1 pair | n-Al$_{0.88}$Ga$_{0.12}$As | 688 |
| | | n-Al$_{0.31}$Ga$_{0.69}$As | 302 |
| 201 | Contact | n-GaAs | 300 |
| 211 | Etch stop | AlAs | 3000 |
| 210 | | GaAs substrate | |

FIG. 16

| Remarks | | Material | Thickness[Å] |
|---|---|---|---|
| | Contact | p-GaAs | 100 |
| Top DBR 1 pair | | p-Al$_{0.31}$Ga$_{0.69}$As | 516 |
| | | p-Al$_{0.88}$Ga$_{0.12}$As | 688 |
| Top DBR Y-1 pairs | | p-Al$_{0.31}$Ga$_{0.69}$As | 623 |
| | | p-Al$_{0.88}$Ga$_{0.12}$As | 688 |
| Micro-cavity | | p-Al$_{0.31}$Ga$_{0.69}$As | 1246 |
| Phase matching | | p-Al$_{0.88}$Ga$_{0.12}$As | 688 |
| Middel DBR X pair | | p-Al$_{0.31}$Ga$_{0.69}$As | 623 |
| | | p-Al$_{0.88}$Ga$_{0.12}$As | 688 |
| Cladding | | Al$_{0.31}$Ga$_{0.69}$As | 40 |
| 3ACQW 50 pairs | | GaAs | 20 |
| | | Al$_{0.20}$Ga$_{0.80}$As | 10 |
| | | GaAs | 60 |
| | | Al$_{0.20}$Ga$_{0.80}$As | 10 |
| | | GaAs | 30 |
| | | Al$_{0.31}$Ga$_{0.69}$As | 40 |
| 3ACQW 45 pairs | | GaAs | 20 |
| | | Al$_{0.20}$Ga$_{0.80}$As | 10 |
| | | GaAs | 66 |
| | | Al$_{0.20}$Ga$_{0.80}$As | 10 |
| | | GaAs | 30 |
| | | Al$_{0.20}$Ga$_{0.80}$As | 40 |
| 3ACQW spare 1 pair | | GaAs | 20 |
| | | Al$_{0.20}$Ga$_{0.80}$As | 10 |
| | | GaAs | 66 |
| | | Al$_{0.20}$Ga$_{0.80}$As | 10 |
| | | GaAs | 30 |
| Cladding | | Al$_{0.31}$Ga$_{0.69}$As | 40 |
| Bottom DBR Y-1 pairs | | n-Al$_{0.88}$Ga$_{0.12}$As | 688 |
| | | n-Al$_{0.31}$Ga$_{0.69}$As | 623 |
| Bottom DBR 1 pair | | n-Al$_{0.88}$Ga$_{0.12}$As | 688 |
| | | n-Al$_{0.31}$Ga$_{0.69}$As | 302 |
| Contact | | n-GaAs | 300 |

FIG. 19

| | | Remarks | Material | Thickness[Å] |
|---|---|---|---|---|
| | 451 | n-contact | n-GaAs | 100 |
| 450 | | Top DBR 1 pair | n-Al$_{0.31}$Ga$_{0.69}$As | 516 |
| | | | n-Al$_{0.88}$Ga$_{0.12}$As | 688 |
| | | Top DBR Y-1 pairs | n-Al$_{0.31}$Ga$_{0.69}$As | 623 |
| | | | n-Al$_{0.88}$Ga$_{0.12}$As | 688 |
| 440 | 444 | Cladding | Al$_{0.31}$Ga$_{0.69}$As | 49 |
| | 443 | SQW 24 pairs | GaAs | 80 |
| | | | Al$_{0.31}$Ga$_{0.69}$As | 40 |
| | | 3ACQW 24 pairs | GaAs | 20 |
| | | | Al$_{0.20}$Ga$_{0.80}$As | 10 |
| | | | GaAs | 58 |
| | | | Al$_{0.20}$Ga$_{0.80}$As | 10 |
| | | | GaAs | 30 |
| | 442 | Active (3-λ) | Al$_{0.31}$Ga$_{0.69}$As | 40 |
| | | 3ACQW spare 1 pair | GaAs | 20 |
| | | | Al$_{0.20}$Ga$_{0.80}$As | 10 |
| | | | GaAs | 58 |
| | | | Al$_{0.20}$Ga$_{0.80}$As | 10 |
| | | | GaAs | 30 |
| | 441 | Cladding | Al$_{0.31}$Ga$_{0.69}$As | 49 |
| 430 | | Middel DBR X/2-1 pairs | p-Al$_{0.88}$Ga$_{0.12}$As | 688 |
| | | | p-Al$_{0.31}$Ga$_{0.69}$As | 623 |
| | | Phase matching | p-Al$_{0.88}$Ga$_{0.12}$As | 688 |
| | 1 pair | p-contact | p-GaAs | 300 |
| | | Phase matching | p-Al$_{0.31}$Ga$_{0.69}$As | 302 |
| | | Middel DBR X/2 pairs | p-Al$_{0.88}$Ga$_{0.12}$As | 688 |
| | | | p-Al$_{0.31}$Ga$_{0.69}$As | 623 |
| | | Phase matching | p-Al$_{0.88}$Ga$_{0.12}$As | 688 |
| 420 | 424 | Cladding | Al$_{0.31}$Ga$_{0.69}$As | 49 |
| | 423 | SQW 24 pairs | GaAs | 80 |
| | | | Al$_{0.31}$Ga$_{0.69}$As | 40 |
| | | 3ACQW 24 pairs | GaAs | 20 |
| | | | Al$_{0.20}$Ga$_{0.80}$As | 10 |
| | | | GaAs | 58 |
| | | | Al$_{0.20}$Ga$_{0.80}$As | 10 |
| | | | GaAs | 30 |
| | 422 | Active (3-λ) | Al$_{0.31}$Ga$_{0.69}$As | 40 |
| | | 3ACQW spare 1 pair | GaAs | 20 |
| | | | Al$_{0.20}$Ga$_{0.80}$As | 10 |
| | | | GaAs | 58 |
| | | | Al$_{0.20}$Ga$_{0.80}$As | 10 |
| | | | GaAs | 30 |
| | 421 | Cladding | Al$_{0.31}$Ga$_{0.69}$As | 49 |
| 410 | | Bottim DBR Y-1 pairs | n-Al$_{0.88}$Ga$_{0.12}$As | 688 |
| | | | n-Al$_{0.31}$Ga$_{0.69}$As | 623 |
| | | Bottim DBR 1 pairs | n-Al$_{0.88}$Ga$_{0.12}$As | 688 |
| | | | n-Al$_{0.31}$Ga$_{0.69}$As | 302 |
| | 401 | n-contact | n-GaAs | 300 |

OPTICAL DEVICE INCLUDING THREE COUPLED QUANTUM WELL STRUCTURE

CROSS-REFERENCE TO RELATED APPLICATION

This application claims priority from Korean Patent Application No. 10-2013-0001214, filed on Jan. 4, 2013, in the Korean Intellectual Property Office, the disclosure of which is incorporated herein in its entirety by reference.

BACKGROUND

1. Field

Exemplary embodiments relate to optical devices including a three coupled quantum well structure. More particularly, exemplary embodiments relate to an optical device including a three coupled quantum well structure, which can achieve both low driving voltage and high optical absorption strength.

2. Description of the Related Art

In addition to taking images, three-dimensional (3D) cameras in the related art also measure distances between a plurality of points on an object and the cameras. In the related art, various algorithms for measuring a distance between an object and a 3D camera have been utilized. A time-of-flight (TOF) method is one of the most commonly used techniques. In the related art, the TOF method is used to measure the time of flight taken for light, emitted by an illumination unit to be irradiated onto an object, reflected from the object, and then received by a light receiving unit. In the related art, the time of flight of the emitted light may be obtained by measuring a phase delay between the emitted light and the received light. In the related art, a high-speed optical modulator is used for measurement of the phase delay.

In order to acquire 3D images with high distance precision, an optical modulator having excellent electro-optical response characteristics is required. To accomplish this, a gallium arsenide (GaAs)-based semiconductor optical modulator of the related art has been used. The GaAs-based semiconductor optical modulator has a P-I-N diode structure in which a multiple quantum well (MQW) structure is disposed between P- and N-electrodes. In this structure of the related art, upon application of a reverse bias voltage to both ends of the P-I-N diode, the MQW structure generates excitons in a certain wavelength region to absorb light. Since an absorption spectrum of the MQW structure tends to move toward a longer wavelength as the reverse bias voltage increases, the degree of absorption at a certain wavelength may vary depending on a change in reverse bias voltages.

Based on the above principle, it is possible to modulate the intensity of incident light of a certain wavelength by adjusting a reverse bias voltage applied to an optical modulator. The extent to which the absorption spectrum moves toward a longer wavelength may be represented as transition energy. In the related art, the transition energy is proportional to the fourth power of a thickness of one quantum well layer and the square of an applied voltage. Thus, as the thickness of one quantum well layer and the applied voltage increase, the absorption spectrum may be displaced toward a longer wavelength. If the transition energy is large, there is a large difference between the degree of absorption when a voltage is applied to an optical modulator and when no voltage is applied thereto. Thus, a high contrast ratio is obtained.

Since electro-optical properties of a GaAs-based semiconductor optical modulator in the related art may vary depending on a temperature, it is desirable to minimize heat emission by lowering a driving voltage of the optical modulator. Because a transition energy is proportional to the fourth power of a thickness of a quantum well layer and the square of an applied voltage as described above, the thickness of the quantum well layer may be increased in order to reduce the driving voltage. However, an increase in the thickness of quantum well layer may degrade an absorption strength of a MQW structure. In general, the absorption strength is inversely proportional to the thickness of the quantum well layer, but is proportional to the square of the overlap integral of wave functions of holes and electrons in the quantum well. As the thickness of the quantum well layer increases, the overlap integral of the hole and electron wave functions decreases. Thus, the number of excitons generated from electron-hole pairs may be decreased, degrading absorption strength. Therefore, when the thickness of the quantum well layer is increased in order to lower the driving voltage, the absorption strength may be reduced. Thus, the performance of the optical modulator may be degraded.

In other words, in the related art, there is a trade-off between the condition of transition energy for low voltage driving and the condition of a high absorption strength. Thus, the driving voltage of the optical modulator in the related art and the thickness of the quantum well layer may be determined by optimizing the trade-off conditions. Increasing the required performance in the optical modulator of the related art necessitates a higher driving voltage.

SUMMARY

Exemplary embodiments may provide optical devices configured to achieve both a reduced driving voltage and an improved optical absorption strength.

Additional aspects will be set forth in part in the description which follows and, in part, will be apparent from the description, or may be learned by practice of the exemplary embodiments.

According to an aspect of an exemplary embodiment, an optical device includes an active layer which includes at least two outer barriers and at least one coupled quantum well, each of the at least one coupled quantum well is sandwiched between the at least two outer barriers. Each of the at least one coupled quantum well includes at least three quantum well layers and at least two coupling barriers interposed between the at least three quantum well layers. The at least two coupling barriers have a potential energy which is higher than a ground level and is lower than energy levels of the at least two outer barriers.

For example, each coupled quantum well may be a three coupled quantum well which includes a first quantum well layer, a first coupling barrier, a second quantum well layer, a second coupling barrier, and a third quantum well layer, which are stacked in this order. The first coupling barrier and the second coupling barrier may have the potential energy which is higher than the ground level and is lower than the energy levels of the at least two outer barriers.

The second quantum well layer may have a higher material thickness than the first quantum well layer, and the first quantum well layer may have a higher material thickness than the third quantum well layer.

The first coupling barrier and the second coupling barrier may have a material thickness such that tunneling of electrons and holes occurs.

In a wavelength band of 850 nm, the at least three quantum well layers may include gallium arsenide (GaAs), the at least two coupling barriers include aluminum gallium arsenide ($Al_yGa_{1-y}As$) ($0<y<1$), and the at least two outer barriers may include $Al_xGa_{1-x}As$ (0<y<x<=1). In a wavelength band of 1550 nm, the at least three quantum well layers may include at least one of indium gallium arsenide ($In_xGa_{1-x}As$), indium gallium aluminum arsenide ($In_{1-x-y}Ga_xAl_yAs$), and indium gallium arsenic phosphate ($In_{1-x}Ga_xAs_zP_{1-z}$), and the at least two coupling barriers and the at least two outer barriers may include at least one of $In_{1-x-y}Ga_xAl_yAs$ and $In_{1-x}Ga_xAs_zP_{1-z}$ (0<x, y, z<1).

The optical device may further include n-contact layers and p-contact layers which are disposed on a lower surface and a upper surface of the active layer, respectively.

The optical device may further include a lower reflective layer and an upper reflective layer which are disposed on a lower surface and an upper surface of the active layer, respectively.

The optical device may be a reflective optical modulator, and the lower reflectively layer may have a reflectivity which is higher than the upper reflective layer.

Alternatively, the optical device may be a transmissive optical modulator, and the lower reflectively layer may have a reflectivity which is equal to that of the upper reflective layer.

At least one of the lower reflective layer and the upper reflective layer may further include at least one micro cavity layer, and when $\lambda$ is a resonant wavelength of the optical device, each of the active layer and the at least one micro cavity layer may have an optical thickness which is an integer multiple of $\lambda/2$.

For example, each of the upper reflective layer and the lower reflective layer may be a distributed Bragg reflector (DBR) layer which includes a repeated stack of alternating first and second refractive index layers which have an optical thickness of $\lambda/4$ and different refractive indices.

The micro cavity layer may be made of a same material as one of the alternating first and second refractive index layers.

The active layer may include a first active layer on the lower reflective layer and a second active layer on the first active layer. The first active layer may include a first quantum well layer, a first coupling barrier, a second quantum well layer, a second coupling barrier, and a third quantum well layer, which are stacked in this order. The second active layer may include a fourth quantum well layer, a third coupling barrier, a fifth quantum well layer, a fourth coupling barrier, and a sixth quantum well layer, which are stacked in this order. The second quantum well layer in the first active layer may have a different material thickness than the fifth quantum well layer in the second active layer.

In this case, the second quantum well layer may have a higher material thicknesses than the first quantum well layer, the first quantum well layer may have a higher material thickness than the third quantum well layer, the fifth quantum well layer may have a higher material thickness than the fourth quantum well layer, and the fourth quantum well layer may have a higher material thickness than the sixth quantum well layer.

The first quantum well layer and the third quantum well layer in the first active layer may have material thickness equal to the fourth quantum layer and the sixth quantum well layer in the second active layer, respectively.

The active layer may include a first active layer having at least one three coupled quantum well structure, each of at least one three coupled quantum well structure includes a first quantum well layer, a first coupling barrier, a second quantum well layer, a second coupling barrier, and a third quantum well layer, which are stacked in this order, and a second active layer having at least one single quantum well structure, each of at least one single quantum well structure includes the at least two outer barriers and a single fourth quantum well layer interposed between the at least two outer barriers.

According to an aspect of another exemplary embodiment, an optical device includes: a lower reflective layer; a first active layer on the lower reflective layer; a middle reflective layer on the first active layer; a second active layer on the middle reflective layer; and an upper reflective layer on the second active layer. At least one of the first active layer and the second active layer may include at least two outer barriers and at least one coupled quantum well, each of the at least one coupled quantum well is sandwiched between the at least two outer barriers. Each of the at least one coupled quantum well includes at least three quantum well layers and at least two coupling barriers which are interposed between the at least three quantum well layers. The at least two coupling barriers have a potential energy which is higher than a ground level and is lower than energy levels of the at least two outer barriers.

For example, each coupled quantum well in the first active layer may include a first quantum well layer, a first coupling barrier, a second quantum well layer, a second coupling barrier, and a third quantum well layer, which are stacked in this order. Each coupled quantum well in the second active layer may include a fourth quantum well layer, a third coupling barrier, a fifth quantum well layer, a fourth coupling barrier, and a sixth quantum well layer, which are stacked in this order.

The first coupling barrier through the fourth coupling barrier may have a potential energy which is higher than the ground level and is lower than the energy levels of the at least two outer barriers.

The second quantum well layer in the first active layer may have a different material thickness than the fifth quantum well layer in the second active layer.

Alternatively, the second quantum well layer in the first active layer may have a material thickness equal to the fifth quantum well layer in the second active layer.

The first quantum well layer and the third quantum well layer in the first active layer may have material thicknesses equal to the fourth quantum well layer and the sixth quantum well layer in the second active layer, respectively.

The first active layer may further include a single quantum well structure having at least two outer barriers and at least one single quantum well layer, each of the at least one single quantum layer is sandwiched between the at least two outer barriers.

The lower reflective layer and the upper reflective layer may be doped to a first conductive type, and the middle reflective layer may be doped to a second conductive type which is electrically opposite to the first conductive type.

According to an aspect of another exemplary embodiment, an optical device includes: a first active layer which includes at least two outer barriers and at least one single quantum well structure; and a second active layer which includes at least one single quantum well structure. Each of the at least one three quantum well structure includes a first quantum well layer, a first coupling barrier, a second quantum well layer, a second coupling barrier, and a third quantum well layer. Each of the at least one single quantum well structure includes a fourth quantum well layer interposed between the at least two outer barriers.

BRIEF DESCRIPTION OF THE DRAWINGS

These and/or other aspects will become apparent and more readily appreciated from the following description of the embodiments, taken in conjunction with the accompanying drawings of which:

FIG. 7 illustrates an example embodiment of the optical device including a three coupled quantum well structure;

FIG. 10 illustrates an exemplary embodiment of the reflective optical modulator of FIG. 9;

FIG. 13 illustrates an exemplary embodiment of the transmissive optical modulator of FIG. 12;

FIG. 16 illustrates an exemplary embodiment of the transmissive optical modulator of FIG. 15;

FIG. 19 illustrates an exemplary embodiment of the transmissive optical modulator of FIG. 18.

DETAILED DESCRIPTION OF THE EXEMPLARY EMBODIMENTS

Figure 1:
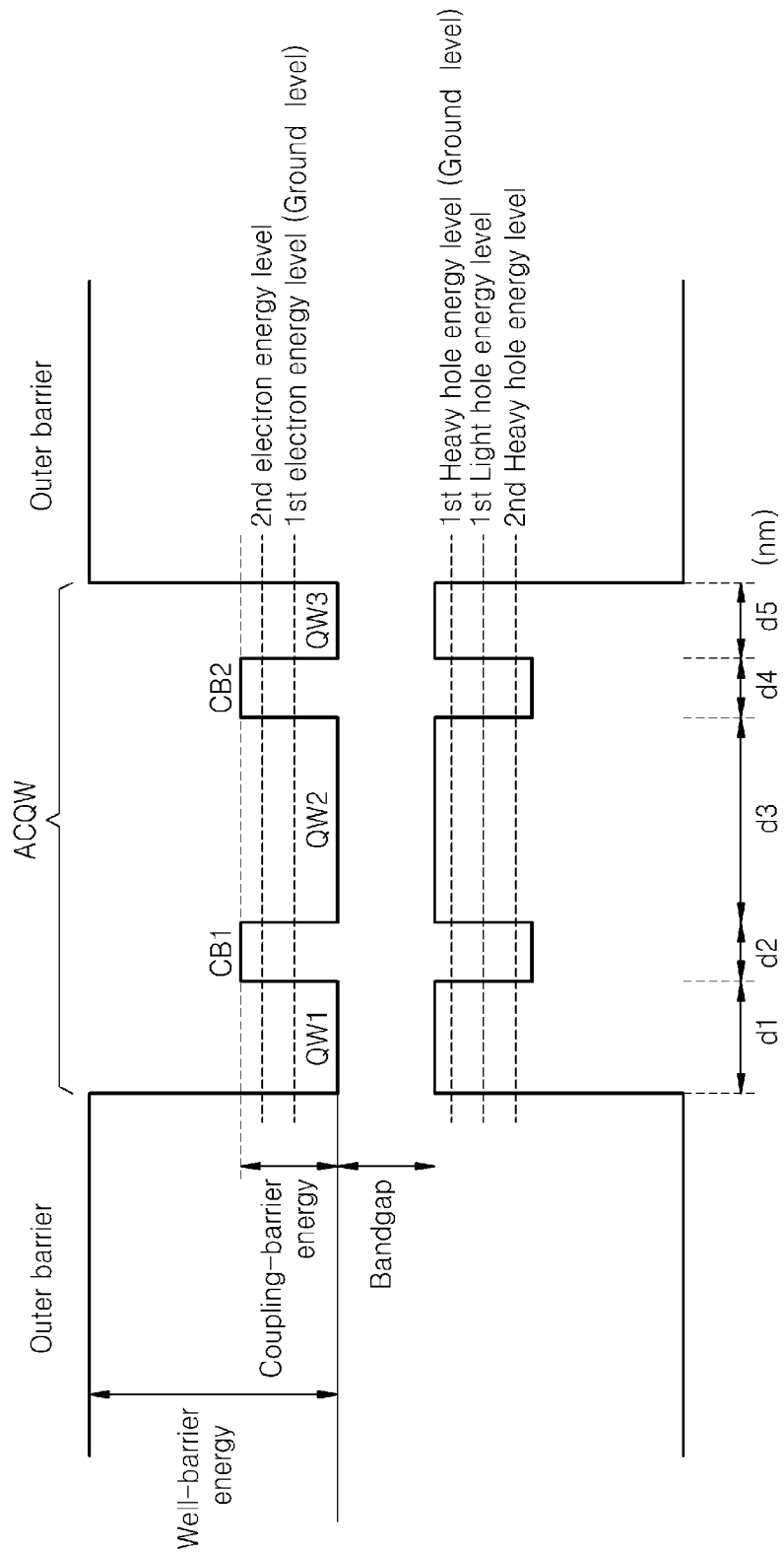
FIG. 1 schematically illustrates an energy band diagram for an active layer including a three coupled quantum well structure according to an embodiment.

Reference will now be made in detail to embodiments, examples of which are illustrated in the accompanying drawings, wherein like reference numerals refer to the like elements throughout. The dimensions of layers and regions may be exaggerated for clarity and convenience of explanation. In this regard, the present embodiments may have different forms and should not be construed as being limited to the descriptions set forth herein. It will also be understood that when a layer or element is referred to as being "on" another layer or substrate, it can be directly on the other layer or substrate, or intervening layers may also be present. Accordingly, the embodiments are merely described below, by referring to the figures, to explain aspects of the detailed description. Expressions such as "at least one of," when preceding a list of elements, modify the entire list of elements and do not modify the individual elements of the list.

FIG. 1 schematically illustrates an energy band diagram for an active layer including a three coupled quantum well structure according to an embodiment.

Referring to FIG. 1, the active layer includes two outer barriers and a three asymmetrically coupled quantum well (ACQW) sandwiched between the two outer barriers. Although FIG. 1 shows only the two outer barriers and one ACQW, the active layer may include a plurality of alternating outer barriers and ACQWs. For example, the active layer may include at least two outer barriers and at least one ACQW, each being interposed between the at least two outer barriers.

Each ACQW includes a first quantum well layer QW1, a first coupling barrier CB1, a second quantum well layer QW2, a second coupling barrier CB2, and a third quantum well layer QW3, which are arranged in this order. In the ACQW structure, the first through third quantum well layers QW1 through QW3 are coupled to one another by the first and second coupling barriers CB1 and CB2. Thus, in the whole active layer structure, the ACQW may function like one quantum well.

As shown in FIG. 1, the first and second coupling barriers CB1 and CB2 may have a lower energy level than that of the outer barriers in order to couple the first through third quantum well layers QW1 through QW3. For example, in a conduction band that is an upper band in the energy band diagram of FIG. 1, the first and second coupling barriers CB1 and CB2 have a potential energy level which is higher than a ground level (i.e., the lowest energy level of first electrons) but is lower than an energy level of the outer barriers. In a valance band that is the lower band therein, the first and second coupling barriers CB1 and CB2 have a potential energy level which is higher than a ground level (i.e., the lowest energy level of first heavy holes), but is lower than the energy level of the outer barriers.

Different material compositions in the quantum well layers QW1 through QW3, the first and second coupling barriers CB1 and CB2, and the outer barriers may be selected depending on an optical wavelength to be used. For example, at an 850 nm infrared region, the first through third quantum well layers QW1 through QW3, the first and second coupling barriers CB1 and CB2, and the outer barriers respectively may be formed of gallium arsenide (GaAs), aluminum gallium arsenide ($Al_yGa_{1-y}As$ (0<y<1)), and $Al_xGa_{1-x}As$ (0<y<x<=1). At a 1550 nm mid-infrared region, the first through third quantum well layers QW1 through QW3 may have various compositions of indium gallium arsenide ($In_xGa_{1-x}As$), indium gallium aluminum arsenide ($In_{1-x-y}Ga_xAl_yAs$), and indium gallium arsenic phosphate ($In_{1-x}Ga_xAs_zP_{1-z}$). The first and second coupling barriers CB1 and CB2 and the outer barriers may have various compositions of $In_{1-x-y}Ga_xAl_yAs$ and $In_{1-x}Ga_xAs_zP_{1-z}$ (0<x, y, z<1). The energy level of the first and second coupling barriers CB1 and CB2 may be adjusted properly depending on composition ratios of materials.

However, exemplary embodiments are not limited to the above wavelengths. For example, at a 940 nm infrared region, the first through third quantum well layers QW1 through QW3, the first and second coupling barriers CB1 and CB2, and the outer barriers respectively may be formed of InGaAs/GaAs, InGaAs/GaAsP, or InGaAs/InGaP.

It should be noted that the absorption wavelength changes according to the aluminum composition ratios. As an example, if the aluminum composition ratio is 0.1, the absorption wavelength at 0V is approximately 830.2 nm. If the aluminum composition ratio is 0.2, the absorption wavelength at 0V is approximately 838.2 nm. If the aluminum composition ratio is 0.3, the absorption wavelength at 0V is approximately 847.3 nm.

In order to obtain the same absorption wavelength of 838.2 nm at 0V, the thickness the central quantum well should be varied. For example, if the aluminum composition ratio is 0.1, the thickness of the central quantum well should be approximately 4.7 nm. If the aluminum composition ratio is 0.2, the thickness of the central quantum well should be approximately 6.6 nm. Finally, if the aluminum composition ratio is 0.3 the thickness of the central quantum well should be approximately 8.0 nm. Moreover, to obtain the same absorption wavelength of 850 nm at 5.2 V, 4.2 V, 6.9 V, the aluminum composition ratios are 0.3, 0.2, 0.1, respectively. Further, for the aluminum composition ratios of 0.3, 0.2, and 0.1 at the same absorption wavelength of 850 nm, the thickness of the central quantum well should be approximately 8.0 nm, 6.6 nm, and 4.7 nm, respectively.

If the aluminum composition ratio is high, the thickness of the central quantum well increases and the movement of the hole and electron wave functions is prevented. Thus, at an aluminum composition ratio of 0.3, optical absorption Is reduced and voltage is increased (e.g., 5.2 V). At a lower aluminum composition ratio (e.g., 0.1), the thickness of the central quantum well is low (4.7 nm) and voltage is also increased (e.g., 6.9 V). Although the optical absorption is improved, the voltage is still higher than the aluminum composition ratio of 0.3.

Therefore, in an exemplary embodiment, low voltage and high absorption may occur at an 0.2 aluminum composition ratio. In this exemplary embodiment, the voltage is 4.2 V and the thickness of the central quantum well is approximately 6.6 nm. Further, at an 0.2 aluminum composition ratio, the movement of the hole and electron wave functions towards both edges improve the overlap between the hole and wave functions in the central quantum well.

Figure 2A:
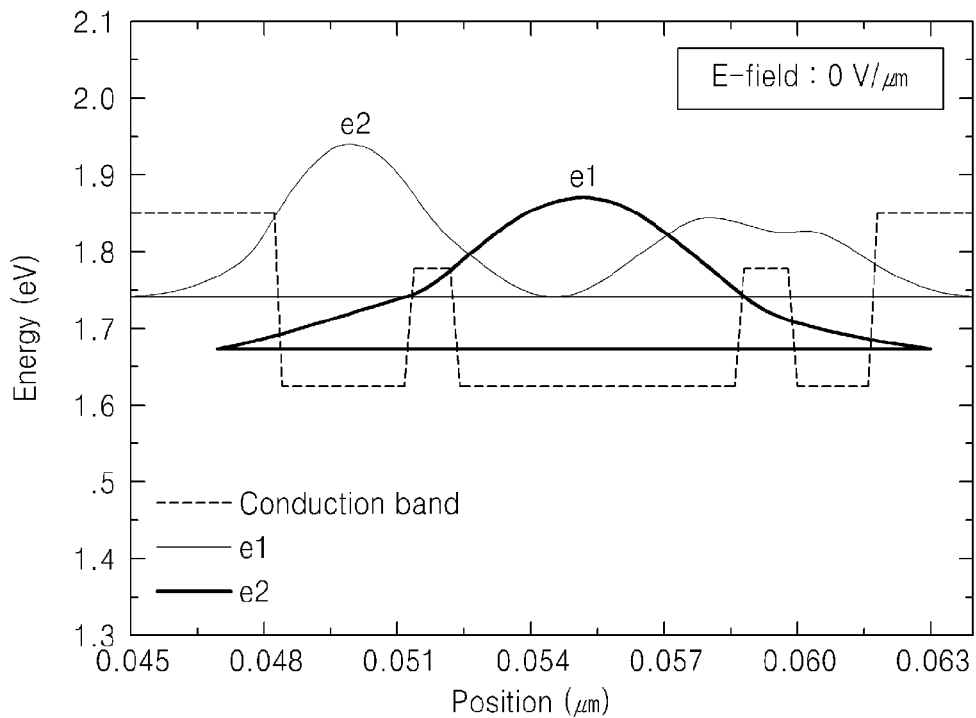
FIGS. 2A and 2B respectively illustrate wave functions of electrons and holes when a reverse bias voltage is not applied to the active layer shown in FIG. 1.
Figure 2B:
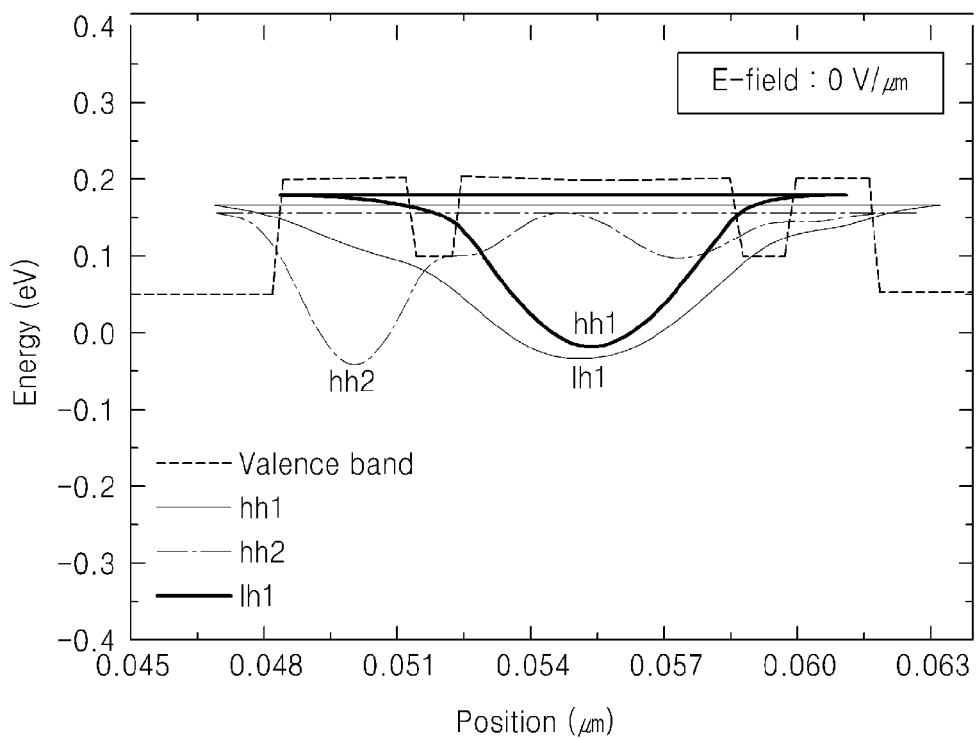

Since the first through third quantum well layers QW1 through QW3 are coupled to one another by the first and second coupling barriers CB1 and CB2 in this way, electron and hole wave functions are distributed over the first through third quantum well layers QW1 through QW3 beyond the first and second coupling barriers CB1 and CB2. For example, FIGS. 2A and 2B illustrate electron and hole wave functions when a reverse bias voltage is not applied to the active layer shown in FIG. 1, respectively. Referring to FIG. 2A, a first electron wave function e1 is distributed mainly within the second quantum well layer QW2 while a second electron wave function e2 is distributed mainly within the first quantum well layer QW1. Referring to FIG. 2B, first heavy and light hole wave functions hh1 and lh1 are distributed mainly within the second quantum well layer QW2 while a second heavy hole wave function is distributed mainly within the first quantum well layer QW1.

Figure 3A:
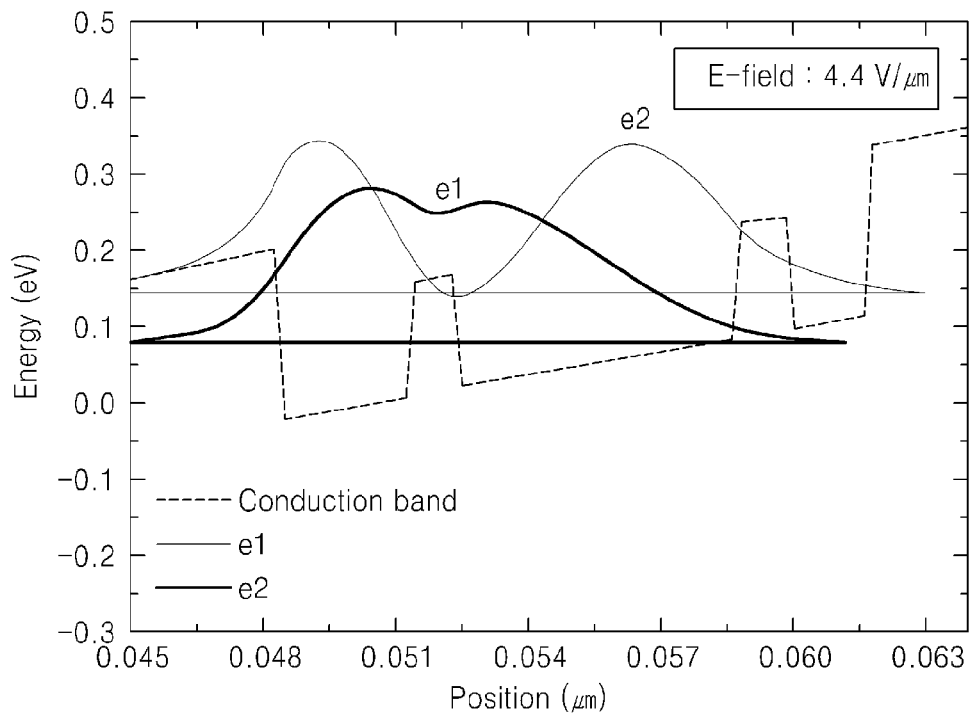
FIGS. 3A and 3B respectively illustrate wave functions of electrons and holes when a reverse bias voltage is applied to the active layer shown in FIG. 1.
Figure 3B:
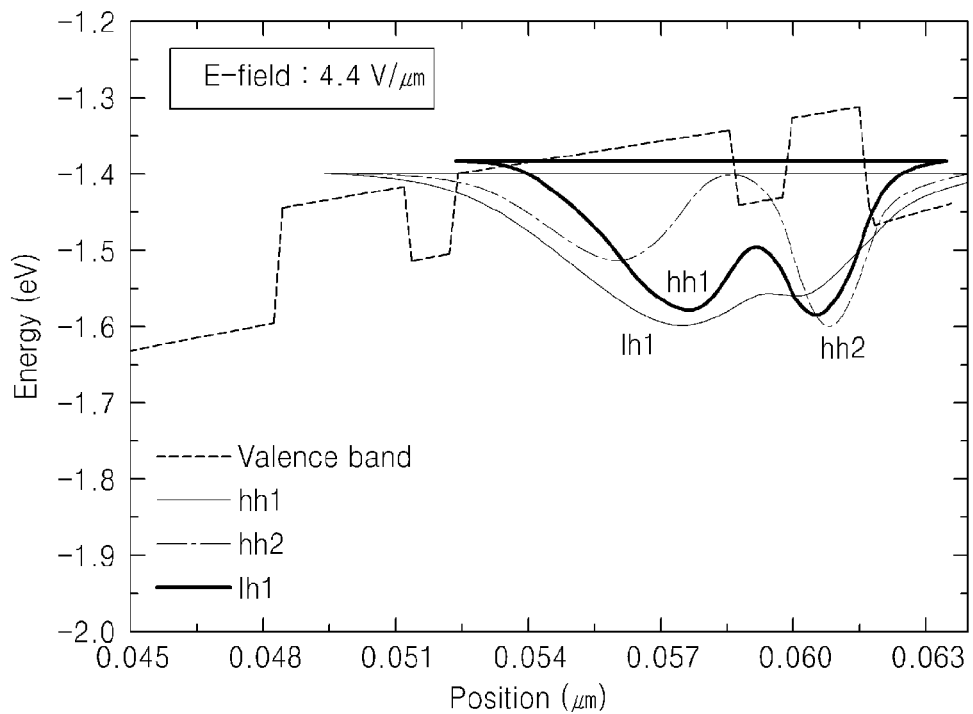

On the other hand, when a reverse bias voltage is applied to the active layer, a first electron wave function moves toward the first quantum well layer QW1 while first and second heavy hole wave functions move toward the third quantum well layer QW3. More specifically, FIGS. 3A and 3B respectively illustrate electron and hole wave functions when a reverse bias voltage is applied to the active layer shown in FIG. 1. Referring to FIG. 3A, a first electron wave function e1 is transformed into a saddle shape by the first coupling barrier CB1 so that a head of the first electron wave function e1 moves to the first quantum well layer QW1 and the remaining portion thereof resides in the second quantum well layer QW2. Furthermore, referring to FIG. 3B, first and second heavy hole wave functions hh1 and hh2 are also transformed into a saddle shape by the second coupling barrier CB2 so that heads of the first and second heavy hole wave functions hh1 and hh2 move to the third quantum well layer QW3 and the remaining portions thereof reside in the second quantum well layer QW2.

When the overlap between hole wave function and electron wave function increases, the number of excitons which are electron-hole pairs increases, thereby increasing optical absorption strength of an optical device. According to the present embodiment, in order to improve optical absorption strength of an optical device including the active layer shown in FIG. 1, the second quantum well layer QW2 may have the largest thickness to increase the overlap between the hole wave function and the electron wave function. In particular, by forming the second quantum well layer QW2 to the largest thickness, portions of the electron and hole wave functions residing in the second quantum well layer QW2 may be increased, thereby increasing the overlap between the hole and electron wave functions.

Furthermore, since holes have lower mobility than that of electrons, the hole wave function may be distributed over a smaller width than the electron wave function. Thus, to suppress most portions of the hole wave function from moving toward the third quantum well layer QW3 upon application of a voltage, the third quantum well layer QW3 may be thinner than the second quantum well layer QW2. In other words, the second quantum well layer QW2 may have the largest thickness, and the third quantum well layer QW3 has the smallest thickness. For example, in the structure shown in FIG. 1, the first, second, and third quantum well layers QW1, QW2, and QW3 respectively have thicknesses d1, d3, and d5 of about 3 nm, about 6.6 nm, and about 2 nm. The first and second coupling barriers CB1 and CB2 may have the thickness suitable to induce tunneling of electrons and holes. The thickness of the coupling barrier may be limited by the tunneling thickness, which is approximately under 2.5 nm.

For example, the first and second coupling barriers CB1 and CB2 respectively have thicknesses d2 and d4 of about 1 to about 1.5 nm, and may not necessarily have the same thickness. In an exemplary embodiment, a 1.5 nm thickness for d2 and d4 of the first and second coupling barriers CB1 and CB2, respectively, will allow for a lower thickness of the central quantum well (e.g., approximately 4.7 nm) without a change in absorption (as compared to a 1.0 nm thickness for d2 and d4). When using the 1.5 nm thickness for d2 and d4, the aluminum composition ratio is 0.1.

As described above, the thickness of the coupling barriers CB1 and CB2 are important design variables in terms of determining the thickness of a central quantum well, the differences in absorption intensity generated by the overlap of the hole and electron wave functions at an operating wavelength, and a magnitude of an applied voltage.

Figure 4A:
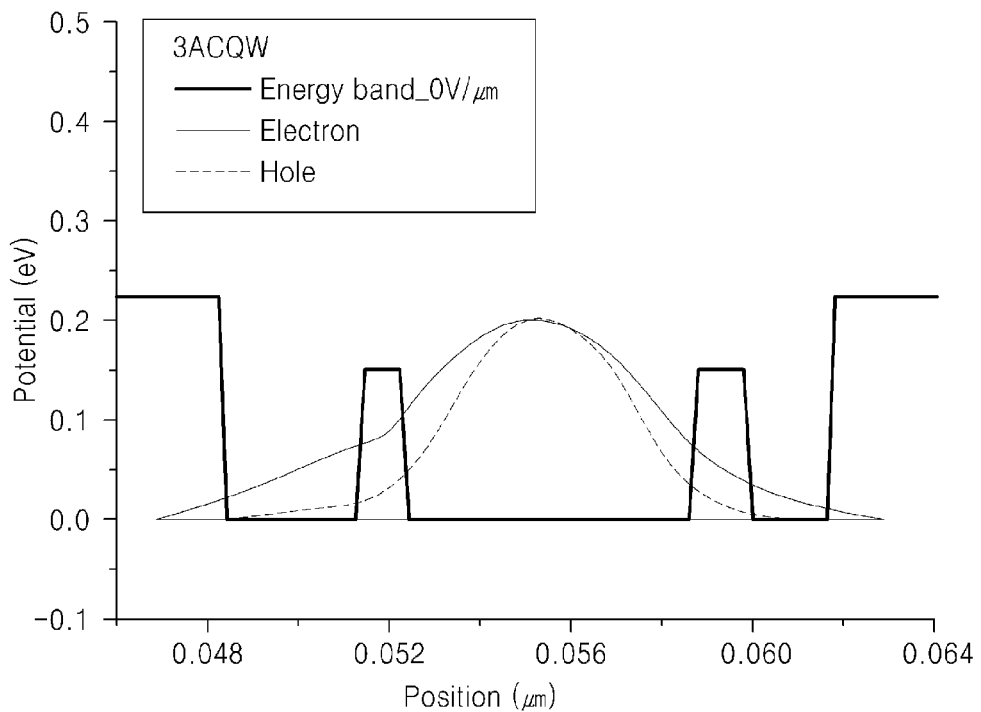
FIGS. 4A through 4C illustrate overlaps between electron and hole wave functions when a reverse bias voltage is not applied to the active layer shown in FIG. 1 and when a reverse bias voltage is applied thereto.
Figure 4B:
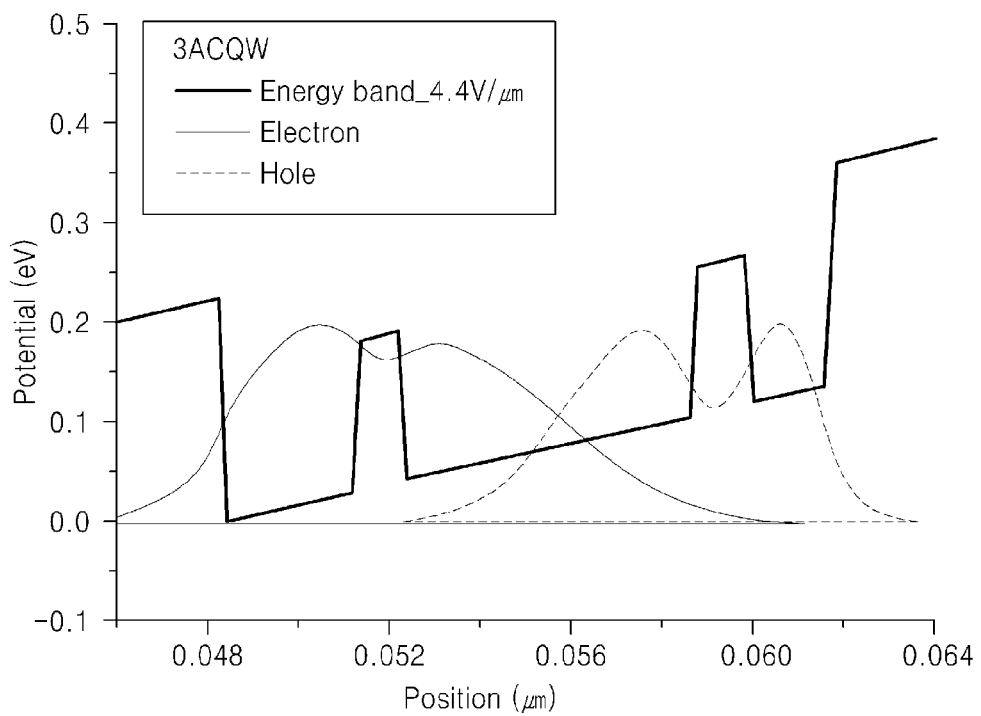
Figure 4C:
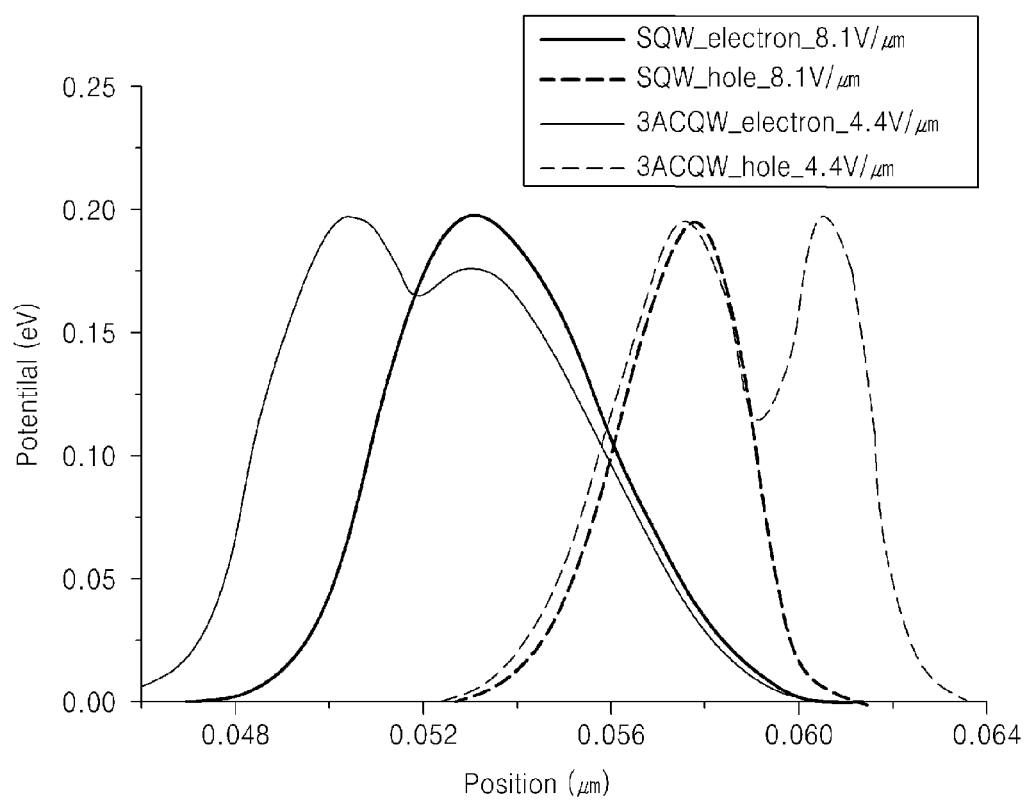

FIGS. 4A through 4C illustrate overlaps between electron and hole wave functions when no voltage is applied to the active layer shown in FIG. 1 and when a voltage is applied. Referring to FIG. 4A, when a reverse bias voltage is not applied to the active layer, most portions of a first electron wave function and a first heavy hole wave function are distributed within the second quantum well layer QW2 so as to overlap each other. On the other hand, referring to FIG. 4B, when the reverse bias voltage is applied to the active layer, a head of the first electron wave function moves toward the first quantum well layer QW1 while a head of the first heavy hole wave function moves toward the third quantum well layer QW3. The remaining portions of the first electron wave function and first heavy hole wave function overlap each other. Although FIGS. 4A and 4B show only the overlap between first electrons and first heavy holes, first and second electrons may overlap first heavy holes, first light holes, and second heavy holes in various combinations.

As shown in FIG. 4B, under an applied electrical field, optical absorption is increased by the overlap between electron and hole wave functions based on the formation of second peaks in a central quantum well. As shown in FIG. 4B, the two coupling barriers are divided into two peaks of the electron and hole wave functions. In the configuration of FIG. 4B, low voltage and high optical absorption can be achieved at the same time.

In contrast, in the related art, a second peak may be generated using only one coupling barrier. However, when the second peak in one coupling barrier is generated in the related art, low voltage and high optical absorption cannot be achieved at the same time.

According to the present embodiment, the three quantum well layers QW1 through QW3 are coupled with one another to increase the overall thickness of a quantum well, thereby reducing a driving voltage of the optical device. Furthermore, the three quantum well layers QW1 through QW3 are asymmetrically arranged to thereby improve the overlap between hole and electron wave functions. Thus, it is possible to reduce the driving voltage of the optical device while increasing the absorption strength thereof.

FIG. 4C illustrate overlaps between electron and hole wave functions for comparison between a single quantum well (SQW) structure and a 3ACQW structure according to the present embodiment. The SQW structure includes $Al_{0.3}Ga_{0.7}As$ barriers and a single GaAs quantum well layer having a thickness of about 8 nm interposed therebetween. By contrast, the 3ACQW structure according to the present embodiment includes an outer barrier, a first quantum well layer, a first coupling barrier, a second quantum well layer, a second coupling barrier, a third quantum well layer, and an outer barrier, which are arranged in this order. $Al_{0.3}Ga_{0.7}As$, GaAs, and $Al_{0.2}Ga_{0.8}As$ were used to form the outer barriers, the first through third quantum well layers, and the first and second coupling barriers, respectively. The first through third quantum well layers each have thicknesses of 3 nm, 6.6 nm, and 2 nm, and the first and second coupling barriers have a thickness of 1 nm. Also, multiple quantum wells (MQWs) are configured so that the SQW structure has the same cavity thickness as the 3ACQW structure. Referring to FIG. 4C, in the SQW structure, overlap between electron and hole wave functions was observed at electric field of about 8.1V/um. However, in the 3ACQW structure, overlap of electron and hole wave functions was observed at electric field of about 4.4V/um. Thus, it can be seen that the optical device using the 3ACQW structure according to the present embodiment achieves a low driving voltage.

Figure 5:
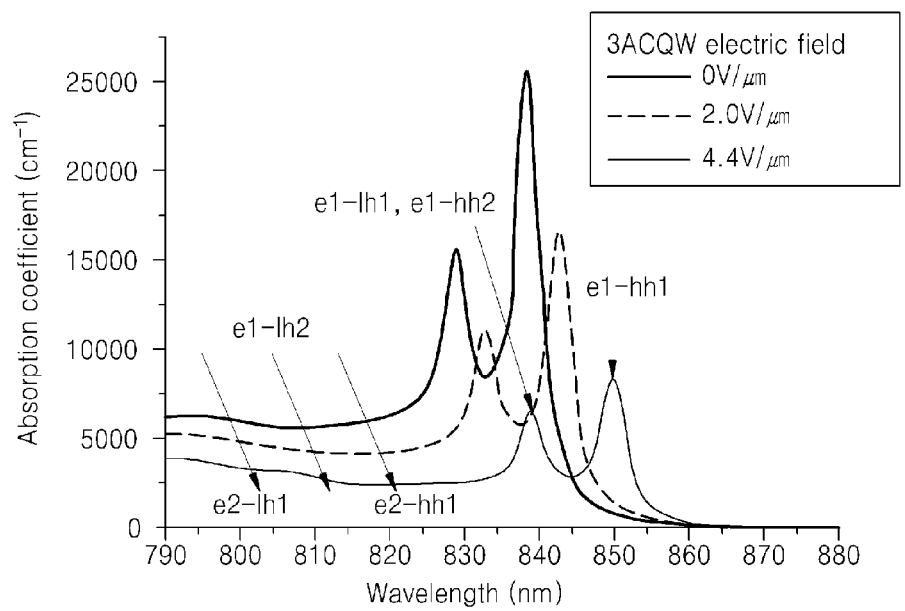
FIG. 5 illustrates absorption spectra in the active layer shown in FIG. 1 including a three coupled quantum well structure.

FIG. 5 illustrates absorption spectra in the active layer including the 3ACQW structure in FIG. 1 for external electric fields of 0V/um, 2.0V/um, and 4.4V/um. Referring to FIG. 5, under an external electric field of 0V/um, an absorption spectrum has the highest peak at a wavelength of about 838 nm due to exciton pairs of first electrons and first heavy holes. A second peak occurs due to exciton pairs of first electrons and first light holes and exciton pairs of first electrons and second heavy holes. As an external electric field increases, the absorption spectra move toward a longer wavelength due to the Stark effect. At the same time, as shown in FIGS. 4A and 4B, an electron wave function and a hole wave function move in opposite directions, thereby decreasing the overlap between the electron and hole wave functions and an absorption strength. For an external electric field 4.4V/um, the absorption spectrum has the highest peak at a wavelength of about 850 nm, whose height is less than for the external electric field of 0V/um. However, as evident from FIG. 4C, the peak of the absorption spectrum shown in FIG. 5 may be reached under an electric field of 8.1 V/um in a SQW structure.

In a 3ACQW structure, when a thickness of a quantum well layer increases, transition energy increases and a ground level decreases, so that an absorption spectrum moves more toward a longer wavelength. When a potential energy of a coupling barrier is increased, an effect of coupling between quantum well layers decreases and a ground level increases, so that the absorption spectrum may move toward a shorter wavelength.

Figure 6:
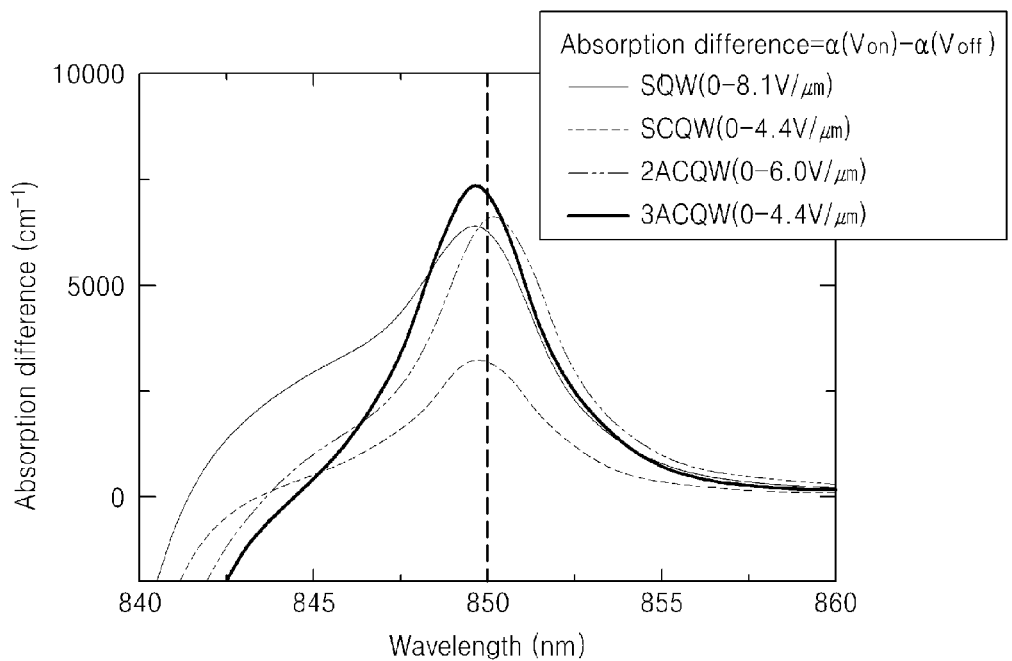
FIG. 6 illustrates comparison of optical absorption characteristics of the active layer shown in FIG. 1 with those of other quantum well structures.

FIG. 6 is a graph illustrating a difference between maximum and minimum absorption coefficients at an 850 nm wavelength in order to compare optical absorption characteristics of the active layer including the ACQW structure as shown in FIG. 1 according to the present embodiment with those of other quantum well structures. In FIG. 6, SQW is a square single quantum well structure, Symmetric coupled quantum well (SCQW) is a structure in which two quantum wells are symmetrically coupled to each other, 2ACQW is a structure in which two quantum wells are asymmetrically coupled to each other, and 3ACQW is a structure in which three coupled quantum wells are asymmetrically coupled to one another. Referring to FIG. 6, the absorption spectrum has a peak at a wavelength of 850 nm under an electric field of 8.1V/um in the SQW, 6.0V/um in the 2ACQW, and 4.4V/um in the SCQW and 3ACQW. In other words, the SCQW and 3ACQW may achieve a low driving voltage. When comparing a difference between an absorption coefficient at 850 nm when no voltage is applied and an absorption coefficient under a voltage at which the peak of the absorption spectrum is reached, SCQW<SQW<2ACQW<3ACQW as shown in FIG. 6, which means that the 3ACQW has the largest absorption coefficient difference. The SCQW may have a low driving voltage and the smallest absorption coefficient difference.

In another related art configuration, even when using a hybrid combination (e.g., 2ACQW and a rectangular quantum well), the thickness of quantum wells are different from each other. Therefore, although this structure may lower a voltage due to a lower transition energy caused by coupling between the two quantum wells, optical absorption is increased. This related art hybrid configuration does not have the same advantages as the exemplary embodiments (i.e., high absorption rate and low voltage).

In another exemplary embodiment, different types of quantum wells may be used in combination with each other. For example, a combination of one three coupled quantum well structure and one single quantum well structure may be used instead of two three coupled quantum well structures. In this exemplary embodiment, in comparison to a related art two single quantum well structure, the transmission increases by approximately 4.86%, the optical bandwidth decreases by approximately −7.9%, and the bias voltage decreases by approximately 33%.

FIG. 7 illustrates an example embodiment of the optical device including the 3ACQW structure. Referring to FIG. 7, an n-contact layer of n-InGaP is first formed on the a GaAs substrate to a thickness of 100 nm, and then an $Al_{0.31}Ga_{0.69}As$ cladding layer is formed on the n-cladding layer to a thickness of 50 nm to act as an outer barrier. Sixteen (16) pairs of 3ACQWs are then stacked on the $Al_{0.31}Ga_{0.69}As$ cladding layer, and each 3ACQW includes first quantum well layer (GaAs, 3 nm)/first coupling barrier ($Al_{0.2}Ga_{0.8}As$, 1 nm)/second quantum well layer (GaAs, 6.6 nm)/second coupling barrier ($Al_{0.2}Ga_{0.8}As$, 1 nm)/third quantum well layer (GaAs, 2 nm). A $Al_{0.31}Ga_{0.69}As$ outer barrier having a thickness of 4 nm is disposed between each of the 3ACQWs. A 50 nm $Al_{0.31}Ga_{0.69}As$ cladding layer acting as an outer barrier is formed on the sixteenth 3ACQW, followed by formation of a 10 nm p-contact layer of p-GaAs thereon. The cladding layer may be thick enough to serve both as the outer barrier and an anti-diffusion layer for preventing diffusion of dopants of the n- and p-contact layers into the 3ACQW. The above-described layers may be deposited using Molecular Beam Epitaxy (MBE) or Metal Organic Chemical Vapor Deposition (MOCVD) equipment. Furthermore, for fabrication of a transmissive optical modulator, the GaAs substrate may be partially removed by wet etching so as to transmit light. In this case, the n-contact layer of n-InGaP may act as an etch stop layer.

Figure 8:
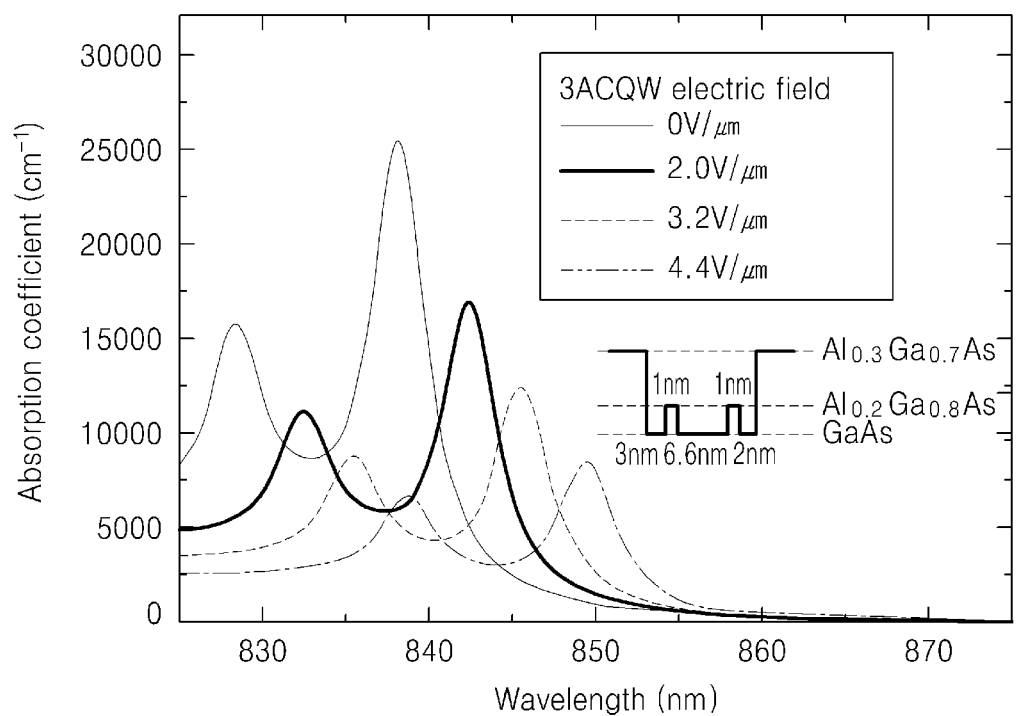
FIG. 8 schematically illustrates an absorption coefficient spectrum of the optical device of FIG. 7.

FIG. 8 schematically illustrates an absorption coefficient spectrum of the optical device of FIG. 7. Referring to FIG. 8, an exciton peak of e1-hh1 is located at 838 nm when no voltage is applied, but reaches 850 nm when an electric field of 4.4V/um is applied. As described above, an SQW having the same cavity thickness as a 3ACQW requires a voltage of 8.1V/um to move the exciton peak of e1-hh1 from 838 nm to 850 nm. Thus, the optical device including the 3ACQWs has a driving voltage that is reduced by about 45.7%, in comparison to the SQW structure while maintaining similar optical absorption.

Thus, the optical device including the ACQW structure may simultaneously achieve reduced driving voltage and improved optical absorption characteristics, in comparison to optical devices including other quantum well structures. The optical device including the ACQW structure may be widely used in optical modulators as well as semiconductor devices having various PIN diode structures for absorbing light of a specific wavelength. For example, the above principles may apply to optical filters, photodiodes, solar cells, light-emitting devices, optical communication systems, and optical interconnections, optical operators, etc.

Various optical modulators employing the above-described ACQW structure will be described in more detail below.

Figure 9:
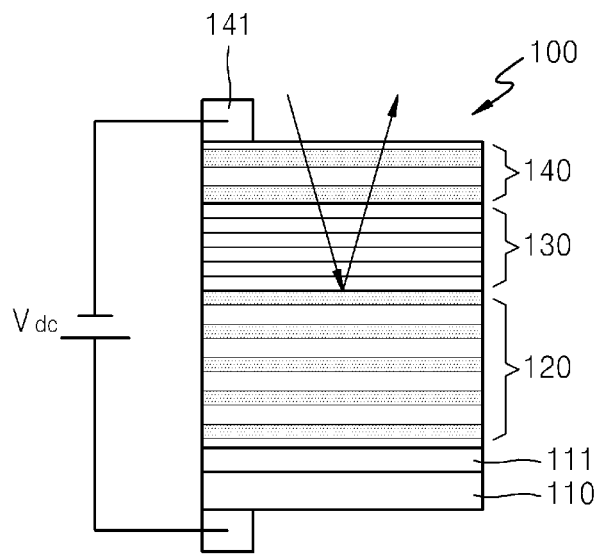
FIG. 9 schematically illustrates a reflective optical modulator having a three coupled quantum well structure according to an embodiment.

FIG. 9 schematically illustrates a reflective optical modulator 100 having a ACQW structure according to an embodiment. Referring to FIG. 9, the reflective optical modulator 100 according to the present embodiment includes a substrate 110, a first contact layer 111 formed on the substrate 110, a lower reflective layer 120 on the first contact layer 111, an active layer 130 on the lower reflective layer 120, an upper reflective layer 140 on the active layer 130, and a second contact layer 141 on the upper reflective layer 140. The upper and lower reflective layers 140 and 120 may be doped so as to serve as an electrical path as well as a reflective layer. For example, the first contact layer 111 and the lower reflective layer 120 may be doped into an n-type while the upper reflective layer 140 and the second contact layer 141 may be doped into a p-type. The active layer 130 is updoped. Thus, the reflective optical modulator 100 has a P-I-N diode structure.

The reflective optical modulator 100 modulates the intensity of reflected light in response to an electrical signal by absorbing a portion of incident light while reflecting the incident light. In order to reflect the incident light, the lower reflective layer 120 may have a reflectance of over 90% (e.g., about 98%), while the upper reflective layer 140 may have a reflectance of about 30 to about 50%. For example, each of the lower and upper reflective layers 120 and 140 may be a distributed Bragg reflector (DBR) formed from a stack of alternating low and high refractive index layers. In this structure, reflection occurs at an interface between high and low refractive index layers with different refractive indices. In this case, by making phases of all reflected beams equal, a high reflectivity may be achieved. Furthermore, the reflectivity may be adjusted to a desired value depending on the number of repeated pairs of high and low refractive index layers. To accomplish this, each of the high and low refractive index layers within the lower and upper reflective layers 120 and 140 may have an optical thickness (the product of a physical thickness and refractive index of a material therein) that is approximately odd-number times of one quarter of a resonant wavelength $\lambda$ of the reflective optical modulator 100 ($\lambda/4$).

The active layer 130 absorbs light and may have a MQW structure including a repeated stack of the above-described ACQW structure and outer barriers. The active layer 130 may also act as a main cavity for Fabry-Perot resonance. To this end, the active layer 130 may have an optical thickness that is approximately equal to an integer multiple of half the resonant wavelength ($\lambda/2$).

FIG. 10 illustrates an exemplary embodiment of the reflective optical modulator 100 of FIG. 9. Referring to FIG. 10, a first contact layer 111 having a thickness of 500 nm is formed of n-GaAs on a GaAs substrate 110. The lower reflective layer 120 includes 25.5 repeated pairs of high refractive index layer of 62.3 nm n-$Al_{0.31}Ga_{0.69}As$ and low refractive index layer of 68.8 nm n-$Al_{0.88}Ga_{0.12}As$. To act as a current path, the lower reflective layer 120 may be doped by using silicon dopant at concentration of about $3.18 \times 10^{18}/cm^3$.

The active layer 130 is formed on the lower reflective layer 120 and includes 11.2 nm $Al_{0.31}Ga_{0.69}As$ cladding layer acting as an outer barrier, and twenty six (26) pairs of 3ACQWs, each having first quantum well layer (3 nm GaAs)/first coupling barrier (1 nm $Al_{0.2}Ga_{0.8}As$)/second quantum well layer (6.6 nm GaAs)/second coupling barrier (1 nm $Al_{0.2}Ga_{0.8}As$)/third quantum well layer (2 nm GaAs), a 4 nm $Al_{0.31}Ga_{0.69}As$ outer barrier disposed between each of the 3ACQWs, and a 11.2 nm $Al_{0.31}Ga_{0.69}As$ cladding layer formed on the 26-th 3ACQW. An optical thickness of the active layer 130 is set to $2\lambda$.

The upper reflective layer 140 on the cladding layer may includes repeated pairs of high refractive index layer of 62.3 nm p-$Al_{0.31}Ga_{0.69}As$ and low refractive index layer of 68.8 nm p-$Al_{0.88}Ga_{0.12}As$. The upper reflective layer 140 with a low reflectivity has only two pairs of the high and low reflective index layers. To act as a current path, the upper reflective layer 140 may be doped using beryllium (Be) dopant at concentration of about $4.6 \times 10^{18}/cm^3$ to about $6.5 \times 10^{18}/cm^3$. The second contact layer 141 of 10 nm p-GaAs is formed on the upper reflective layer 140.

Figure 11:
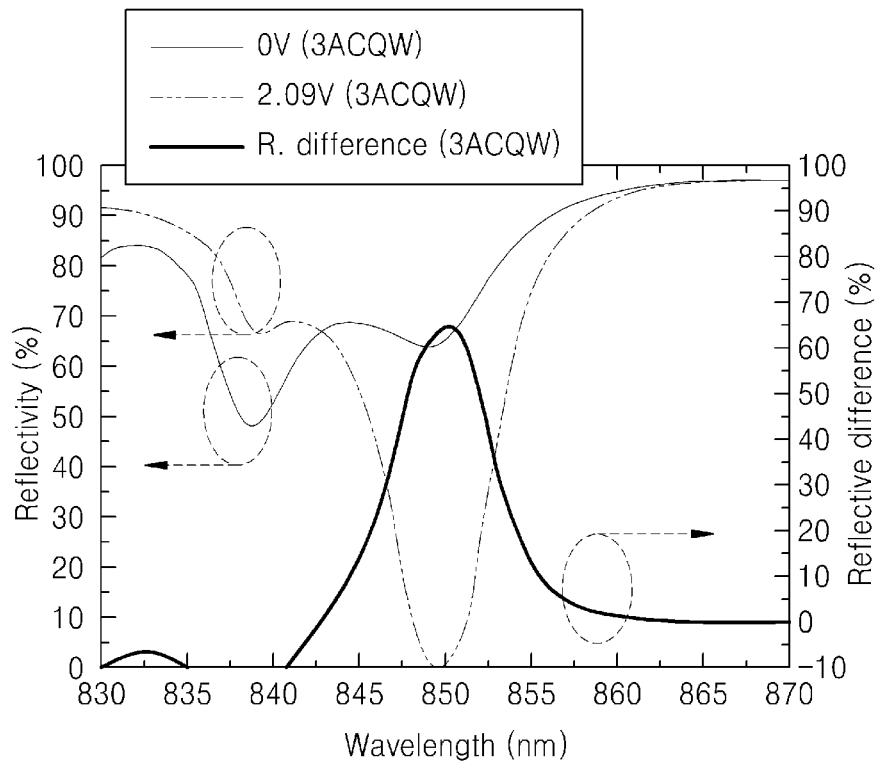
FIG. 11 is a graph schematically illustrating reflectivity characteristics of the reflective optical modulator of FIG. 10.

FIG. 11 is a graph schematically illustrating reflectivity characteristics of the reflective optical modulator 100 of FIG. 10. In the graph of FIG. 11, a thin solid line curve represents a reflectivity (left ordinate) measured when no voltage is applied, a dash-dot-dot line curve represents a reflectivity (left ordinate) measured under a voltage of about −2.09V, and a bold solid line curve represents a reflective difference (right ordinate) between the reflectivities measured without an applied voltage and in the presence of an applied voltage. Referring to FIG. 11, maximum absorption occurs at a wavelength of 850 nm, and a reflective difference between minimum and maximum reflectivities at the wavelength of 850 nm is about 65%.

Figure 12:
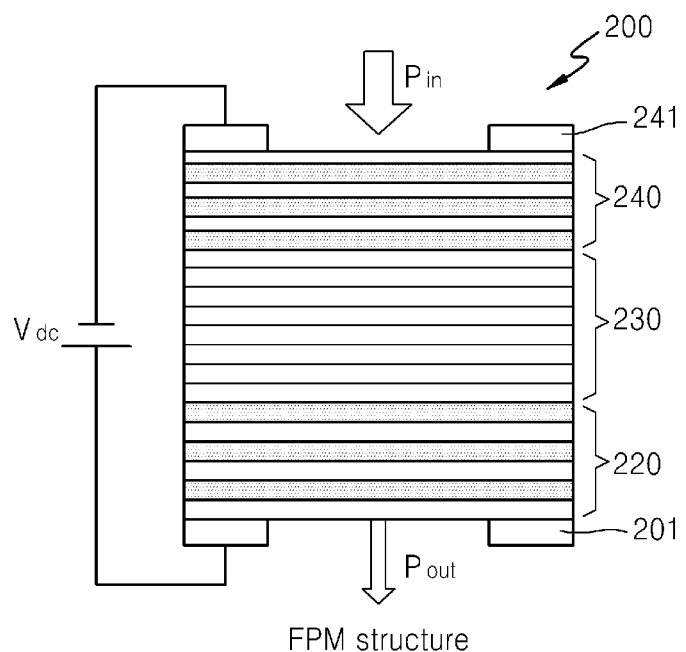
FIG. 12 schematically illustrates a transmissive optical modulator having a three coupled quantum well structure according to an embodiment.

FIG. 12 schematically illustrates a transmissive optical modulator 200 including a 3ACQW structure according to an embodiment. Referring to FIG. 12, the transmissive optical modulator 200 according to the present embodiment includes a lower reflective layer 220, an active layer 230 on the lower reflective layer 220, an upper reflective layer 240 on the active layer, a first contact layer 201 disposed on a portion of a lower surface of the lower reflective layer 220, and a second contact layer 241 disposed on a portion of a upper surface of the upper reflective layer 240. The first and second contact layers 201 and 241 may be formed in a ring shape along edges of the lower and upper reflective layers 220 and 240 so as to transmit light. Although a substrate is not shown in FIG. 12, the substrate may be removed after forming the transmissive optical modulator 200 on the substrate. Alternatively, only a central portion of the substrate may be removed so that light can pass therethrough. As described above, the upper and lower reflective layers 240 and 220 may be doped so as to serve as an electrical path as well as a reflective layer.

The transmissive optical modulator 200 modulates the intensity of transmitted light in response to an electrical signal by absorbing a portion of incident light while transmitting the incident light. The lower and upper reflective layers 220 and 240 reflect incident light so that resonance occurs in the active layer 230 acting as a main cavity while transmitting a portion of the incident light. In the transmissive optical modulator 200, the lower and upper reflective layers 220 and 240 may have the same reflectivity of approximately 50%.

FIG. 13 illustrates an exemplary embodiment of the transmissive optical modulator 200 of FIG. 12. Referring to FIG. 13, an etch stop layer 211 of aluminum arsenide (AlAs) is formed on the substrate 210, and the first contact layer 201 of n-GaAs is formed on the etch stop layer 211. InGaP may be used as a material of the etch stop layer 211 instead of AlAs. The lower reflective layer 220 is formed on the first contact layer 201 and includes 6 repeated pairs of high refractive index layer of n-$Al_{0.31}Ga_{0.69}As$ and low refractive index layer of n-$Al_{0.88}Ga_{0.12}As$. The lowermost high refractive index layer in the lower reflective layer 220 may have a thickness less than those of the remaining high refractive index layers in order to achieve phase matching. A central portion of the substrate 210 may be removed after forming the transmissive optical modulator 200.

The active layer 230 on the lower reflective layer 220 includes upper and lower cladding layers and forty (40) pairs of 3ACQWs sandwiched between the upper and lower cladding layers. Each 3ACQW includes first quantum well layer (3 nm GaAs)/first coupling barrier (1 nm $Al_{0.2}Ga_{0.8}As$)/second quantum well layer (6.6 nm GaAs)/second coupling barrier (1 nm $Al_{0.2}Ga_{0.8}As$)/third quantum well layer (2 nm GaAs). A 4 nm $Al_{0.31}Ga_{0.69}As$ outer barrier may be disposed between each of the 3ACQWs. An optical thickness of the active layer 230 is set to $3\lambda$.

The upper reflective layer 240 is arranged symmetrically to the lower reflective layer 220, with the active layer 230 sandwiched therebetween. For example, like the lower reflective layer 220, the upper reflective layer 240 includes repeated 6 pairs of high refractive index layer of p-$Al_{0.31}Ga_{0.69}As$ and low refractive index layer of p-$Al_{0.88}Ga_{0.12}As$. Furthermore, the uppermost high refractive index layer in the upper reflective layer 240 may have a thickness less than those of the remaining high refractive index layers in order to achieve phase matching. The second contact layer 241 of p-GaAs is disposed on the upper reflective layer 240.

Figure 14:
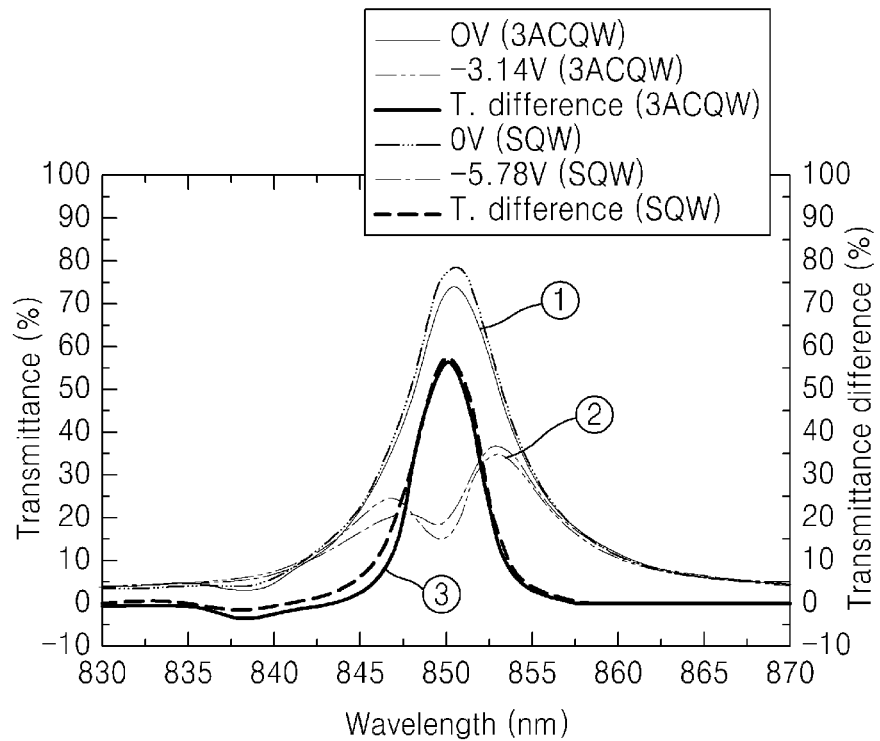
FIG. 14 is a graph schematically illustrating transmittance characteristics of the transmissive optical modulator of FIG. 13.

FIG. 14 is a graph schematically illustrating transmittance characteristics of the transmissive optical modulator 200 of FIG. 13. In the graph of FIG. 14, two curves indicated by '1' represent transmittances (left ordinate) measured when no voltage is applied. Two curves indicated by '2' represent transmittances (left ordinate) in the presence of an applied voltage. Two curves indicated by '3' represent a transmittance difference (right ordinate) between the transmittances represented by the curves '1' and '2'. Furthermore, three curves in FIG. 14 indicate transmittance characteristics of the transmissive optical modulator 200 of FIG. 13 while the other three curves indicate transmittance characteristics of a related art optical modulator having a SQW structure. The related art optical modulator may be similar to the transmissive optical modulator 200 in overall structure, but differs in that fifty nine (59) SQWs are arranged in the an active layer. The active layer in the related art optical modulator also has an optical thickness of $3\lambda$. Referring to FIG. 14, although the related art optical modulator has almost the same transmittance characteristics as the transmissive optical modulator 200, the transmissive optical modulator 200 achieves the desired performance at a driving voltage of −3.14V, in comparison to the related art optical modulator achieving a same performance at a driving voltage of −5.78V.

A central absorption wavelength of an optical modulator is varied depending on process variables in a manufacturing process and temperature change. In order to maintain modulation characteristics despite such changes, it is advantageous to provide a uniform modulation over a wide wavelength range. In other words, an optical modulator may have a wide bandwidth.

Figure 15:
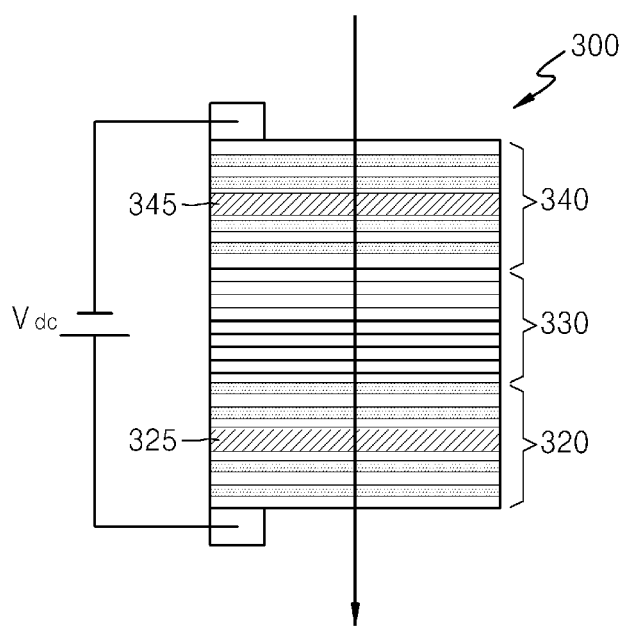
FIG. 15 schematically illustrates a transmissive optical modulator having a three coupled quantum well structure according to another embodiment.

FIG. 15 schematically illustrates a wide-bandwidth transmissive optical modulator 300 having a ACQW structure according to another embodiment. Referring to FIG. 15, the transmissive optical modulator 300 includes a lower reflective layer 320, an active layer 330 on the lower reflective layer 320, an upper reflective layer 340 on the active layer 330, a first micro cavity layer 325 disposed within the lower reflective layer 320, and a second micro cavity layer 345 disposed within the upper reflective layer 340. The active layer 300 acts as a main cavity for Fabry-Perot resonance while the first and second micro cavity layers 325 and 245 serve as sub-cavities. To accomplish this, the micro cavity layers 325 and 345 may have an optical thickness that is equal to an integer multiple of $\lambda/2$. The micro cavity layers 325 and 345 may also be formed of a material of a high or low refractive index layer. While the micro cavity layers 325 and 345 are disposed in the lower and upper reflective layers 320 and 340, respectively, one of the micro cavity layers 325 and 345 may be omitted.

Although not clearly shown in FIG. 15, quantum well layers in the active layer 330 may have different thicknesses in order to increase a bandwidth of the transmissive optical modulator 300. For example, by varying thicknesses of second quantum well layers in which the overlap between hole and electron wave functions occurs, the second quantum well layers may have two or more thicknesses. Addition of the micro cavity layers 325 and 345 and varying a thickness of a quantum well layer may increase an absorption mode, thereby improving an optical absorption bandwidth of the transmissive optical modulator 300.

FIG. 16 illustrates an exemplary embodiment of the transmissive optical modulator 300 of FIG. 15. Referring to FIG. 16, the lower reflective layer 320 is formed on an n-GaAs contact layer and includes Y pairs of high refractive index layer of n-$Al_{0.31}Ga_{0.69}As$ and low refractive index layer of n-$Al_{0.88}Ga_{0.12}As$. In the exemplary embodiment of FIG. 16, a micro cavity layer is not formed in the lower reflective layer 320 while one micro cavity layer 345 is formed in the upper reflective layer 340. The upper reflective layer 340 is divided into first and second upper reflective layers 341 and 344 by the micro cavity layer 345. The first upper reflective layer 341 underlying the micro cavity layer 345 includes X pairs of high and low reflective layers while the second upper reflective layer 344 on the micro cavity layer 345 includes Y pairs of high and low reflective layers. In this case, X and Y are arbitrary natural numbers and may be selected appropriately according to the desired reflectivity characteristics of the lower and upper reflective layers 320 and 340. The micro cavity layer 345 is formed of a material having a high refractive index layer and an optical thickness of $\lambda/2$.

The upper reflective layer 340 may further include a phase matching layer 342 interposed between the micro cavity layer 345 and the first upper reflective layer 341. The phase matching layer 342 may be inserted so that the overall structure of the upper reflective layer 340 including the micro cavity layer 345 consists of repeated pairs of high and low refractive index layers. For example, if the micro cavity layer 345 is made of a material of a high refractive index layer, the phase matching layer 342 may be made of a material of a low refractive index layer. Conversely, if the micro cavity layer 345 is formed of a material of a low refractive index layer, the phase matching layer 342 may be formed of a material of a high refractive index layer.

In the exemplary embodiment of FIG. 16, the active layer 330 includes lower and upper cladding layers 331 and 334 and two 3ACQW structures 332 and 333. The lower 3ACQW structure 332 includes forty six (46) pairs of 3ACQWs, each having first quantum well layer/first coupling barrier/second quantum well layer/second coupling barrier/third quantum well layer, and outer barriers sandwiched between each of the 3ACQWs. The second quantum well layer in the lower 3ACQW structure 332 has a thickness of 6.6 nm. The upper 3ACQW structure 333 includes fifty (50) pairs of 3ACQWs, each having first quantum well layer/first coupling barrier/second quantum well layer/second coupling barrier/third quantum well layer, and outer barriers sandwiched between each of the 3ACQWs. The second quantum well layer in the upper 3ACQW structure 333 has a thickness of 6.0 nm. By varying thicknesses of the second quantum well layers in the upper and lower 3ACQW structures 332 and 333, the active layer 330 may have two absorption modes, thereby providing an increased optical absorption bandwidth. In this case, the overall optical thickness of the active layer 330 is set to $7\lambda$.

Figure 17:
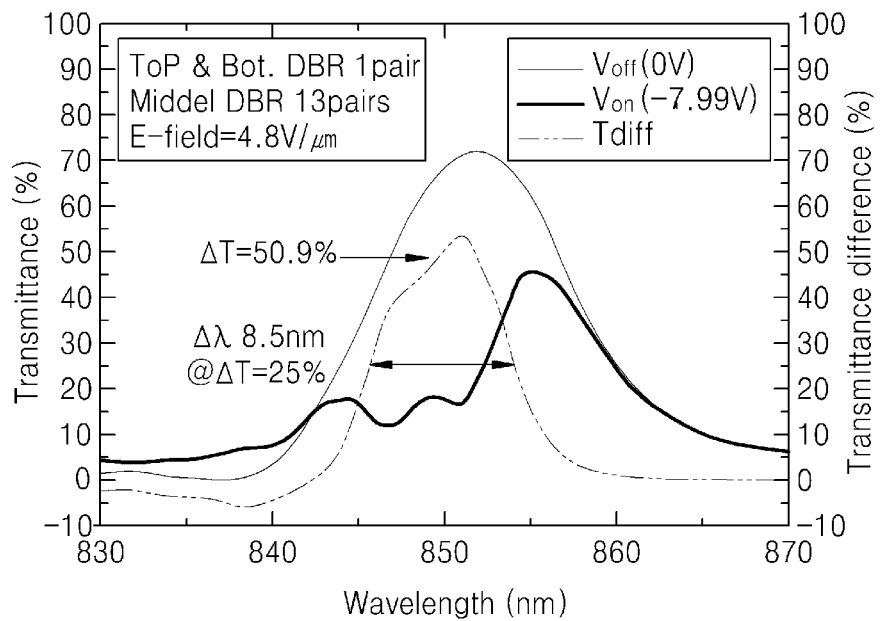
FIG. 17 is a graph schematically illustrating transmittance characteristics of the transmissive optical modulator of FIG. 16.

FIG. 17 is a graph schematically illustrating transmittance characteristics of the transmissive optical modulator 300 of FIG. 16. In the graph of FIG. 17, a thin solid line curve represents a transmittance measured when no voltage is applied, a bold solid line curve represents a transmittance measured under an applied voltage, and a dash-dot-dot line curve represents a difference in the transmittances represented by the thin and bold solid line curves. As shown in the graph of FIG. 17, the transmittance difference of about 50.9% is obtained for a wavelength of 850 nm at a driving voltage of −7.99V, and the transmittance difference of more than 25% is achieved over a bandwidth of about 8.5 nm.

Although the upper reflective layer 340 has the micro cavity layer 345, and the active layer 330 includes the two 3ACQW structures 332 and 333, the lower and upper reflective layers 320 and 340 may include at least one additional micro cavity in order to increase a bandwidth. Furthermore, the active layer 330 may include a combination of one 3ACQW structure and one SQW structure. The use of the micro cavity layer 345 and the structure of the active layer 330 shown in FIG. 16 may also be applied to the reflective optical modulator 100 of FIG. 9.

Figure 18:
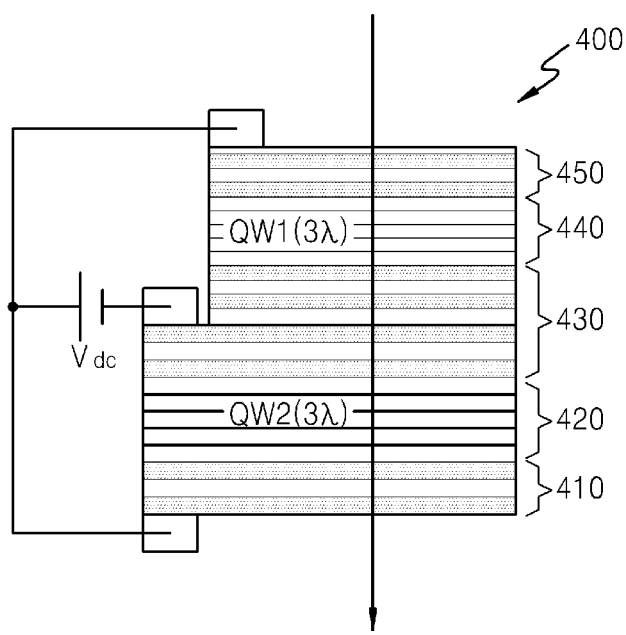
FIG. 18 schematically illustrates a transmissive optical modulator having a three coupled quantum well structure according to another embodiment.

FIG. 18 schematically illustrates a transmissive optical modulator 400 having a ACQW structure according to another embodiment. Referring to FIG. 18, the transmissive optical modulator 400 according to the present embodiment includes a lower reflective layer 410, a first active layer 420 on the lower reflective layer 410, an middle reflective layer 430 on the first active layer 420, a second active layer 440 on the middle reflective layer 430, and an upper reflective layer 450 on the second active layer 440. The lower and upper reflective layers 410 and 450 may be doped into the same conductive type and the middle reflective layer 430 may be doped into a conductive type opposite to that of the lower and upper reflective layers 410 and 450. For example, the lower and upper reflective layers 410 and 450 may be doped into an n-type, and the middle reflective layer 430 may be doped into a p-type. Alternatively, the lower and upper reflective layers 410 and 450 may be doped into a p-type, and the middle reflective layer 430 may be doped into an n-type. Thus, the transmissive optical modulator 400 of FIG. 18 may have an N-I-P-I-N or P-I-N-I-P structure.

In this regard, the transmissive optical modulator 400 may have a stacked diode structure in which two diodes are stacked so as to be electrically connected in parallel. A driving voltage of an optical modulator is proportional to the overall thickness of an active layer (or the total number of quantum well layers in the active layer). The transmissive optical modulator 400 having the two active layers 420 and 440 electrically connected in parallel achieves a driving voltage that is reduced by about 50% compared to an optical modulator having one active layer with a thickness equal to the sum of the thicknesses of the two active layers 420 and 440. Thus, power consumption may be further reduced, minimizing degradation in the performance of the transmissive optical modulator 400.

Furthermore, the first active layer 420 has a different quantum well structure from that of the second active layer 440, thereby resulting in an increase in a bandwidth of the transmissive optical modulator 400. More specifically, the transmissive optical modulator 400 uses a multi resonant mode in which the first and second active layers 420 and 440 have different resonant wavelengths. Therefore, an increased absorption mode and an enhanced optical absorption bandwidth are provided. Also, each of the first and second active layers 420 and 440 may have at least two different types of quantum well structures.

FIG. 19 illustrates an exemplary embodiment of the transmissive optical modulator 400 of FIG. 18. Referring to FIG. 19, the lower reflective layer 410 is disposed on an n-contact layer 401 of n-GaAs. The lower reflective layer 410 may include Y pairs of high refractive index layer of n-$Al_{0.31}Ga_{0.69}As$ and low refractive index layer of n-$Al_{0.88}Ga_{0.12}As$. The lowermost high refractive index layer in the lower reflective layer 410 may have a thickness less than those of the remaining high refractive index layers in order to achieve phase matching.

The first active layer 420 on the lower reflective layer 410 includes two different types of quantum well structures 422 and 423. For example, the first active layer 420 includes a lower cladding layer 421, a 3ACQW structure 422 including twenty five (25) pairs of 3ACQWs on the lower cladding layer 421, and a single quantum well (SQW) structure 423 including twenty four (24) pairs of SQW layers on the 3ACQW structure 422. Each 3ACQW in the 3ACQW structure 422 includes first quantum well layer (3 nm GaAs)/first coupling barrier (1 nm $Al_{0.2}Ga_{0.8}As$)/second quantum well layer (5.8 nm GaAs)/second coupling barrier (1 nm $Al_{0.2}Ga_{0.8}As$)/third quantum well layer (2 nm GaAs). A 4 nm outer barrier is disposed between each of the 3ACQWs. Conversely, the SQW structure 423 includes repeated 24 pairs of alternating SQW layer (8 nm GaAs) and outer barrier (4 nm $Al_{0.31}Ga_{0.69}As$). An upper cladding layer 424 is disposed on the SQW structure 423. The first active layer 420 has an optical thickness of $3\lambda$.

The middle reflective layer 430 is disposed on the first active layer 420 and includes X pairs of high refractive index layer of $p\text{-}Al_{0.31}Ga_{0.69}As$ and low refractive index layer of $p\text{-}Al_{0.88}Ga_{0.12}As$. A phase matching layer of a low refractive index material may be interposed between the middle reflective layer 430 and the first active layer 420. The middle reflective layer 430 may have a p-contact layer of p-GaAs therein.

In the exemplary embodiment of FIG. 19, the second active layer 440 may have substantially the same structure as the first active layer 420. For example, the second active layer 440 includes a lower cladding layer 441, a 3ACQW structure 442 and including twenty five (25) pairs of 3ACQWs on the lower cladding layer 441, and a SQW structure 443 including twenty four (24) pairs of SQW layers on the 3ACQW structure 442. Each 3ACQW in the 3ACQW structure 442 includes first quantum well layer (3 nm GaAs)/first coupling barrier (1 nm $Al_{0.2}Ga_{0.8}As$)/second quantum well layer (5.8 nm GaAs)/second coupling barrier (1 nm $Al_{0.2}Ga_{0.8}As$)/third quantum well layer (2 nm GaAs). A 4 nm outer barrier is disposed between each of the 3ACQWs. Conversely, the SQW structure 443 includes repeated 24 pairs of alternating SQW layer (8 nm GaAs) and outer barrier (4 nm $Al_{0.31}Ga_{0.69}As$). An upper cladding layer 444 is disposed on the SQW structure 443. The second active layer 440 has an optical thickness of $3\lambda$.

The upper reflective layer 450 is disposed on the second active layer 440 and includes Y pairs of high refractive index layer of $n\text{-}Al_{0.31}Ga_{0.69}As$ and low refractive index layer of $n\text{-}Al_{0.88}Ga_{0.12}As$. An n-contact layer 451 is disposed on the upper reflective layer 450. The uppermost high refractive index layer in the upper reflective layer 450 may have a thickness less than those of the remaining high refractive index layers in order to achieve phase matching.

Figure 20:
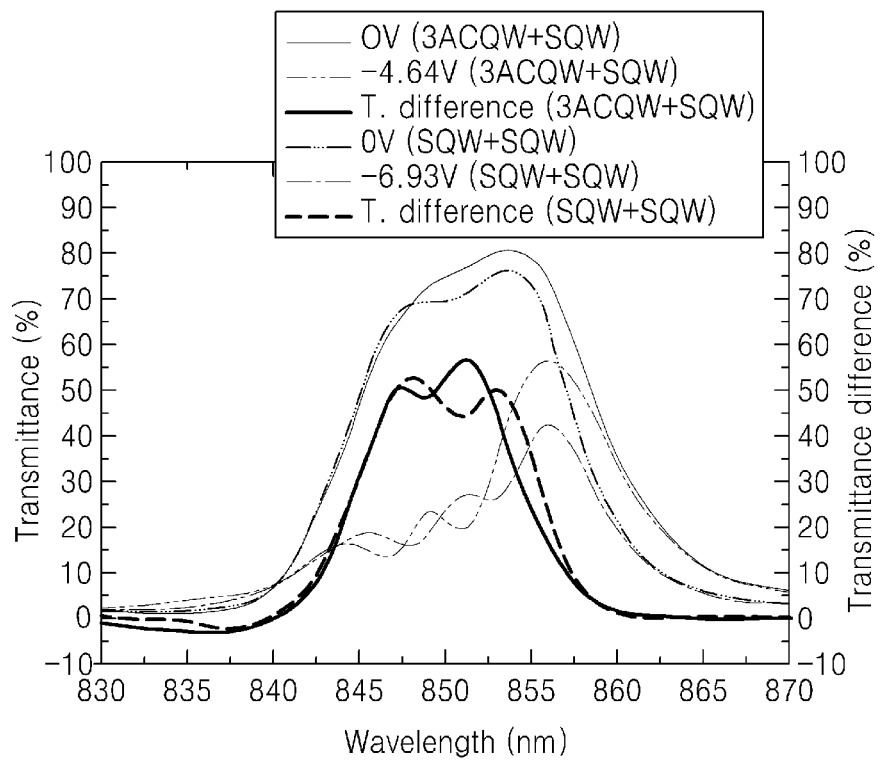
FIG. 20 is a graph schematically illustrating transmittance characteristics of the transmissive optical modulator of FIG. 19.

FIG. 20 is a graph schematically illustrating a comparison between transmittance characteristics of the transmissive optical modulator 400 of FIG. 19 and a related art optical modulator having a SQW structure. The related art optical modulator may be almost the same as the transmissive optical modulator 400 in overall structure, but differs in that two active layers have SQW structures. The two active layers in the related art optical modulator also have an optical thickness of $3\lambda$. Referring to FIG. 20, although the related art optical modulator has almost the same transmittance characteristics as the transmissive optical modulator 400, the transmissive optical modulator 400 achieves the desired performance at a driving voltage of $-4.64V$, while the related art optical modulator achieves the same at a driving voltage of $-6.93V$.

The transmissive optical modulator 400 is completely symmetrical with respect to the middle reflective layer 430. However, the transmissive optical modulator 400 may have an asymmetrical shape. For example, the transmissive optical modulator 400 may be configured so that the first and second active layers 420 and 440 may respectively include a SQW structure and a ACQW structure, or a ACQW structure and a SQW structure. The transmissive optical modulator 400 may also use various combinations by adjusting thicknesses of individual quantum well layers in the first active layer 420 to be equal to or different from those of their counterparts in the second active layer 440.

While the exemplary embodiments have been particularly shown and described with reference to exemplary embodiments thereof, it should be understood that the exemplary embodiments described therein should be considered in a descriptive sense only and not for purposes of limitation. It will also be understood by those of ordinary skill in the art that various changes in form and details may be made therein without departing from the spirit and scope of the present invention as defined by the following claims.

What is claimed is:

1. An optical device comprising:
an active layer which comprises at least two outer barriers and at least one coupled quantum well, each of the at least one coupled quantum well is sandwiched between the at least two outer barriers,
wherein each of the at least one coupled quantum well comprises at least three quantum well layers and at least two coupling barriers interposed between the at least three quantum well layers,
wherein the at least two coupling barriers have a potential energy which is higher than a ground level and is lower than energy levels of the at least two outer barriers, and
wherein the at least two coupling barriers have a material thickness such that tunneling of electrons and holes occurs.

2. The optical device of claim 1, wherein each coupled quantum well is a three coupled quantum well which comprises a first quantum well layer, a first coupling barrier, a second quantum well layer, a second coupling barrier, and a third quantum well layer, and
wherein the first coupling barrier and the second coupling barrier have the potential energy which is higher than the ground level and is lower than the energy levels of the at least two outer barriers.

3. The optical device of claim 2, wherein the second quantum well layer has a higher material thickness than the first quantum well layer, and the first quantum well layer has a higher material thickness than the third quantum well layer.

4. The optical device of claim 1, wherein in a wavelength band of 850 nm, the at least three quantum well layers comprise gallium arsenide (GaAs), the at least two coupling barriers comprise aluminum gallium arsenide ($Al_yGa_{1-y}As$) ($0<y<1$), and the at least two outer barriers comprise $Al_xGa_{1-x}As$ ($0<y<x<=1$).

5. The optical device of claim 1, wherein in a band of a wavelength of 1550 nm, the at least three quantum well layers comprise at least one of indium gallium arsenide ($In_xGa_{1-x}As$), indium gallium aluminum arsenide ($In_{1-x-y}Ga_xAl_yAs$), and indium gallium arsenic phosphide ($In_{1-x}Ga_xAs_zP_{1-z}$), and the at least two coupling barriers and the at least two outer barriers comprise at least one of $In_{1-x-y}Ga_xAl_yAs$ and $In_{1-x}Ga_xAs_zP_{1-z}$ ($0<x, y, z<1$).

6. The optical device of claim 1, further comprising n-contact layers and p-contact layers which are disposed on a lower surface and an upper surface of the active layer, respectively.

7. The optical device of claim 1, further comprising a lower reflective layer and an upper reflective layer which are disposed on a lower surface and an upper surface of the active layer, respectively.

8. The optical device of claim 7, wherein the optical device is a reflective optical modulator, and the lower reflective layer has a reflectivity which is higher than the upper reflective layer.

9. The optical device of claim 7, wherein the optical device is a transmissive optical modulator, and the lower reflective layer has a reflectivity which is equal to the upper reflective layer.

10. The optical device of claim 7, wherein at least one of the lower reflective layer and the upper reflective layer further comprises at least one micro cavity layer, and when $\lambda$ is a resonant wavelength of the optical device, each of the active layer and the at least one micro cavity layer has an optical thickness which is an integer multiple of $\lambda/2$.

11. The optical device of claim 10, wherein each of the upper reflective layer and the lower reflective layer is a distributed Bragg reflector (DBR) layer which comprises a repeated stack of alternating first and second refractive index layers having an optical thickness of $\lambda/4$ and different refractive indices.

12. The optical device of claim 11, wherein the micro cavity layer is made of a same material as one of the alternating first and second refractive index layers.

13. The optical device of claim 7, wherein the active layer comprises a first active layer on the lower reflective layer and a second active layer on the first active layer,
   wherein the first active layer comprises a first quantum well layer, a first coupling barrier, a second quantum well layer, a second coupling barrier, and a third quantum well layer,
   wherein the second active layer comprises a fourth quantum well layer, a third coupling barrier, a fifth quantum well layer, a fourth coupling barrier, and a sixth quantum well layer, and
   wherein the second quantum well layer in the first active layer has a different material thickness than the fifth quantum well layer in the second active layer.

14. The optical device of claim 13, wherein the second quantum well layer has a higher material thickness than the first quantum well layer, the first quantum well layer has a higher material thickness than the third quantum well layer, the fifth quantum well layer has a higher material thickness than the fourth quantum well layer, and the fourth quantum well layer has a higher material thickness than the sixth quantum well layer.

15. The optical device of claim 13, wherein the first quantum well layer and the third quantum well layer in the first active layer have material thicknesses equal to the fourth quantum well layer and the sixth quantum well layer in the second active layer, respectively.

16. The optical device of claim 7, wherein the active layer comprises a first active layer having at least one three coupled quantum well structure, each of at least one three coupled quantum well structure comprises a first quantum well layer, a first coupling barrier, a second quantum well layer, a second coupling barrier, and a third quantum well layer, and a second active layer having at least one single quantum well structure, each of at least one single quantum well structure comprises a single fourth quantum well layer interposed between the at least two outer barriers.

17. An optical device comprising:
   a lower reflective layer;
   a first active layer on the lower reflective layer;
   a middle reflective layer on the first active layer;
   a second active layer on the middle reflective layer; and
   an upper reflective layer on the second active layer,
   wherein at least one of the first active layer and the second active layer comprises at least two outer barriers and at least one coupled quantum well, each of the at least one coupled quantum well is sandwiched between the at least two outer barriers,
   wherein each of the at least one coupled quantum well comprises at least three quantum well layers and at least two coupling barriers which are interposed between the at least three quantum well layers,
   wherein the at least two coupling barriers have a potential energy which is higher than a ground level and is lower than energy levels of the at least two outer barriers, and
   wherein the at least two coupling barriers have a material thickness such that tunneling of electrons and holes occurs.

18. The optical device of claim 17, wherein each coupled quantum well in the first active layer comprises a first quantum well layer, a first coupling barrier, a second quantum well layer, a second coupling barrier, and a third quantum well layer, and
   wherein each coupled quantum well in the second active layer comprises a fourth quantum well layer, a third coupling barrier, a fifth quantum well layer, a fourth coupling barrier, and a sixth quantum well layer.

19. The optical device of claim 18, wherein the second quantum well layer has a higher material thickness than the first quantum well layer, the first quantum well layer has a higher material thickness than the third quantum well layer, the fifth quantum well layer has a higher material thickness than the fourth quantum well layer, and the fourth quantum well layer has a higher material thickness than the sixth quantum well layer.

20. The optical device of claim 19, wherein the first coupling barrier through the fourth coupling barrier have a potential energy which is higher than the ground level and is lower than the energy levels of the at least two outer barriers.

21. The optical device of claim 19, wherein the second quantum well layer in the first active layer has a different material thickness than the fifth quantum well layer in the second active layer.

22. The optical device of claim 19, wherein the second quantum well layer in the first active layer has a material thickness equal to the fifth quantum well layer in the second active layer.

23. The optical device of claim 19, wherein the first quantum well layer and the third quantum well layer in the first active layer have material thicknesses equal to the fourth quantum well layer and the sixth quantum well layer in the second active layer, respectively.

24. The optical device of claim 17, wherein the first active layer further comprises a single quantum well structure having at least two outer barriers and at least one single quantum well layer, each of the at least one single quantum layer is sandwiched between the at least two outer barriers.

25. The optical device of claim 17, wherein the second active layer further comprises a single quantum well structure having at least two outer barriers and at least one single quantum well layer, each of the at least one single quantum layer is sandwiched between the at least two outer barriers.

26. The optical device of claim 17, wherein the lower reflective layer and the upper reflective layer are doped to a first conductive type, and the middle reflective layer is doped to a second conductive type which is electrically opposite to the first conductive type.

27. The optical device of claim 17, wherein at least one of the lower reflective layer and the upper reflective layer further comprises at least one micro cavity layer, and when $\lambda$ is a resonant wavelength of the optical device, each of the first active layer, the second active layer, and the at least one micro cavity layer has an optical thickness which is an integer multiple of $\lambda/2$.

28. The optical device of claim 27, wherein each of the upper reflective layer and the lower reflective layer is a distributed Bragg reflector (DBR) layer comprising a repeated stack of alternating first and second refractive index layers which have an optical thickness of $\lambda/4$ and different refractive indices.

29. The optical device of claim 27, wherein the at least one micro cavity layer is made of a same material as one of the alternating first and second refractive index layers.

30. An optical device comprising:
a first active layer which comprises at least two outer barriers and at least one three quantum well structure; and
a second active layer which comprises at least one single quantum well structure,
wherein each of the at least one three quantum well structure comprises a first quantum well layer, a first coupling barrier, a second quantum well layer, a second coupling barrier, and a third quantum well layer,
wherein each of the at least one single quantum well structure comprises a fourth quantum well layer interposed between the at least two outer barriers, and
wherein the first and second coupling barriers have a material thickness such that tunneling of electrons and holes occurs.

31. The optical device of claim 30, wherein the first coupling barrier and the second coupling barrier have a potential energy which is higher than a ground level and is lower than energy levels of the at least two outer barriers.

32. The optical device of claim 30, wherein the second quantum well layer has a higher material thickness than the first quantum well layer, and the first quantum well layer has a higher material thickness than the third quantum well layer.

33. The optical device of claim 30, wherein the first coupling barrier and the second coupling barrier have a material thickness in a range of approximately 1nm to approximately 1.5 nm.

34. The optical device of claim 33, wherein the material thickness of the first coupling barrier and the second coupling barrier is approximately 1.5 nm.

* * * * *